(12) United States Patent
Tsuji et al.

(10) Patent No.: US 9,728,275 B2
(45) Date of Patent: Aug. 8, 2017

(54) MEMORY SYSTEM THAT HANDLES ACCESS TO BAD BLOCKS

(71) Applicant: KABUSHIKI KAISHA TOSHIBA, Tokyo (JP)

(72) Inventors: Nobuhiro Tsuji, Yokohama Kanagawa (JP); Kenichirou Kada, Yokohama Kanagawa (JP); Shinya Takeda, Yokohama Kanagawa (JP); Toshihiko Kitazume, Kawasaki Kanagawa (JP); Shunsuke Kodera, Yokohama Kanagawa (JP); Tetsuya Iwata, Yokohama Kanagawa (JP); Yoshio Furuyama, Yokosuka Kanagawa (JP); Hirosuke Narai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/062,012

(22) Filed: Mar. 4, 2016

(65) Prior Publication Data
US 2017/0062076 A1 Mar. 2, 2017

(30) Foreign Application Priority Data
Aug. 27, 2015 (JP) .................................. 2015-167324

(51) Int. Cl.
| G11C 29/38 | (2006.01) |
| G06F 3/06 | (2006.01) |
| G11C 29/44 | (2006.01) |

(52) U.S. Cl.
CPC .............. *G11C 29/38* (2013.01); *G06F 3/064* (2013.01); *G06F 3/0619* (2013.01);
(Continued)

(58) Field of Classification Search
CPC ...... G06F 3/0619; G06F 3/064; G06F 3/0653; G06F 3/0659; G06F 3/0679; G11C 29/38; G11C 29/44
(Continued)

(56) References Cited

U.S. PATENT DOCUMENTS

| 7,092,314 B2 | 8/2006 | Setogawa |
| 7,480,774 B2 | 1/2009 | Ellis et al. |

(Continued)

FOREIGN PATENT DOCUMENTS

| JP | 2004062978 | 2/2004 |
| JP | 2004310751 A | 11/2004 |
| JP | 4570321 B2 | 10/2010 |

OTHER PUBLICATIONS

Micron NAND Flash Memory, Serial Peripheral Interface (SPI), MT29F1G01AAADD, 43 pages.

*Primary Examiner* — Christine Tu
(74) *Attorney, Agent, or Firm* — Patterson & Sheridan, LLP

(57) ABSTRACT

A memory system includes a plurality of pins for connection to the outside of the memory system, one of the pins being configured to receive a command signal, a memory cell array including a plurality of first memory blocks and a second memory block in which status data indicating which of the first memory blocks is defective, is stored, and a control circuit configured to determine whether or not a first memory block targeted by the command signal is indicated as being defective in the status data. The control circuit allows an operation to be performed on the targeted first memory block in accordance with the command signal when the targeted first memory block is not indicated as being defective, and blocks the operation to be performed on the
(Continued)

targeted first memory block when the targeted first memory block is indicated as being defective.

20 Claims, 30 Drawing Sheets

(52) U.S. Cl.
CPC .......... *G06F 3/0653* (2013.01); *G06F 3/0659* (2013.01); *G06F 3/0679* (2013.01); *G11C 29/44* (2013.01)

(58) Field of Classification Search
USPC ........ 714/719, 710, 711, 723, 6.13, 6.2, 6.1, 714/6.12; 365/200, 201
See application file for complete search history.

(56) References Cited

U.S. PATENT DOCUMENTS

| | | | |
|---|---|---|---|
| 2009/0161430 A1* | 6/2009 | Allen ................... | G11C 29/76 365/185.09 |
| 2012/0072786 A1* | 3/2012 | Bahali .................. | G06F 11/008 714/704 |
| 2012/0324299 A1* | 12/2012 | Moshayedi ......... | G06F 11/1068 714/710 |

* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

FIG. 4

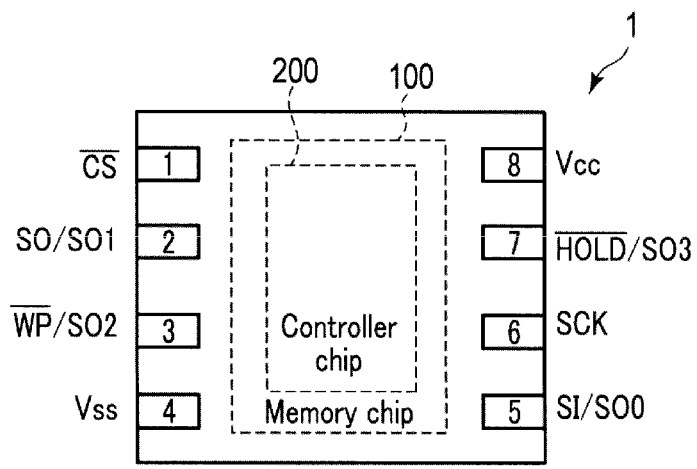

FIG. 5

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

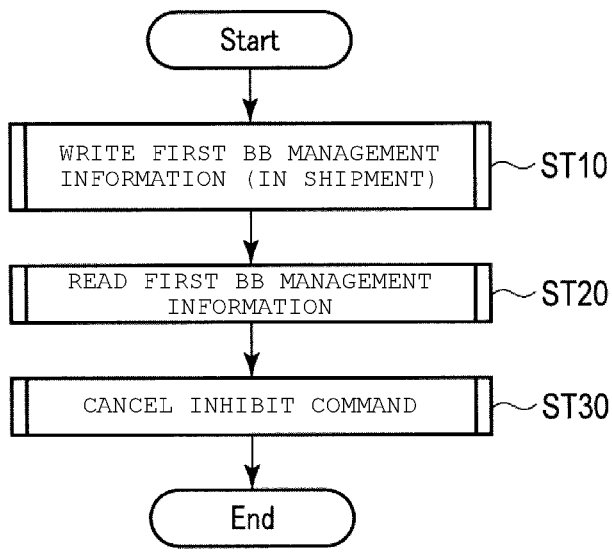

MEMORY SYSTEM THAT HANDLES ACCESS TO BAD BLOCKS

CROSS-REFERENCE TO RELATED APPLICATION

This application is based upon and claims the benefit of priority from Japanese Patent Application No. 2015-167324, filed Aug. 27, 2015, the entire contents of which are incorporated herein by reference.

FIELD

Embodiments described herein relate generally to a memory system, in particular, memory system that handles access to bad blocks.

BACKGROUND

A NAND-type flash memory is widely known as one type of a memory device.

DESCRIPTION OF THE DRAWINGS

FIG. 3 illustrates functions of external terminals of the memory system.

FIG. 4 is an exterior plan view of a memory system according to one or more embodiments.

FIG. 5 illustrates functions of external terminals of the memory system shown in FIG. 4.

FIG. 21 schematically illustrates a bad block table according to the first embodiment.

FIGS. 22-25 are flowcharts illustrating operations according to the first embodiment.

FIGS. 33 and 34 each schematically illustrate a memory system and a peripheral configuration thereof according to a third embodiment.

DETAILED DESCRIPTION

Figure 1:
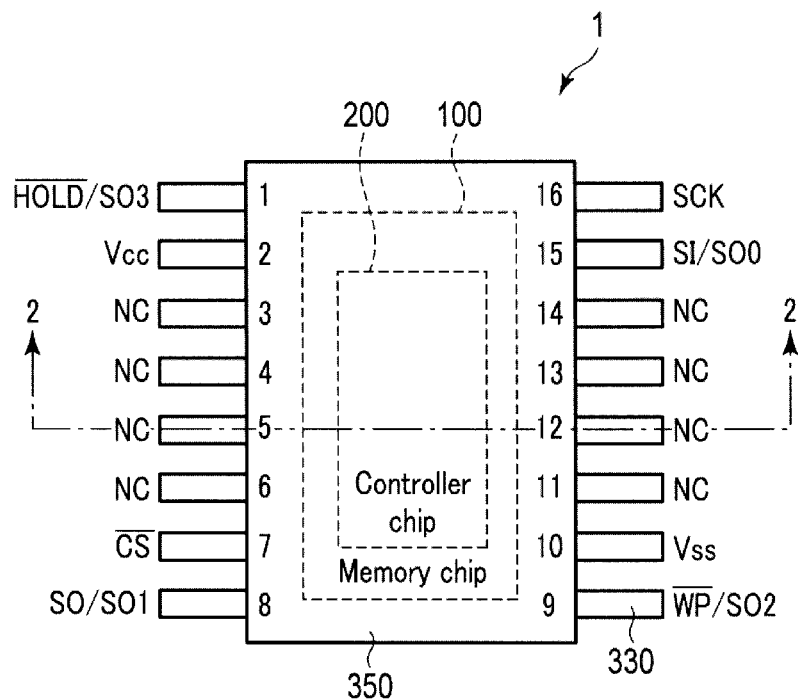
FIG. 1 is an exterior plan view of a memory system according to one or more embodiments.

One or more embodiments are directed to providing a memory system capable of inhibiting an erasing operation and a writing operation on a bad block.

In general, according to an embodiment, a memory system includes a plurality of pins for connection to the outside of the memory system, the pins including a first pin configured to receive a chip select signal, a second pin configured to receive a clock signal, and a third pin configured to receive a command signal in synchronization with the clock signal, a memory cell array including a plurality of first memory blocks and a second memory block in which status data indicating whether or not each of the first memory blocks is defective, is stored, and a control circuit configured to determine whether or not a first memory block targeted by the command signal is indicated as being defective in the status data. The control circuit allows an operation to be performed on the targeted first memory block in accordance with the command signal when the targeted first memory block is not indicated as being defective in the status data, and blocks the operation to be performed on the targeted first memory block when the targeted first memory block is indicated as being defective in the status data.

Hereinafter, embodiments will be described with reference to the drawings. In the following description, elements having the same function and configuration are described with the same reference numerals.

0. Configurations Common to Embodiments

First, configurations common to memory systems according to the embodiments will be described.

0.1 Configuration

0.1.1 Entire Configuration of Memory System

First, an entire configuration of the memory system according to the embodiments will be described with reference to FIGS. 1 and 2. FIG. 1 is an exterior plan view of the memory system according to the embodiments, and FIG. 2 is a cross-sectional view thereof taken along the line 2-2 in FIG. 1.

As illustrated, a memory system 1 includes two semiconductor chips (modules) 100 and 200. The semiconductor chip (memory chip) 100 includes a semiconductor memory such as a NAND-type flash memory, and the semiconductor chip 200 (controller chip) includes a controller which controls the memory chip 100. The semiconductor chips 100 and 200 are mounted on a lead frame 300, and are packaged by being sealed with a resin 350.

Figure 2:
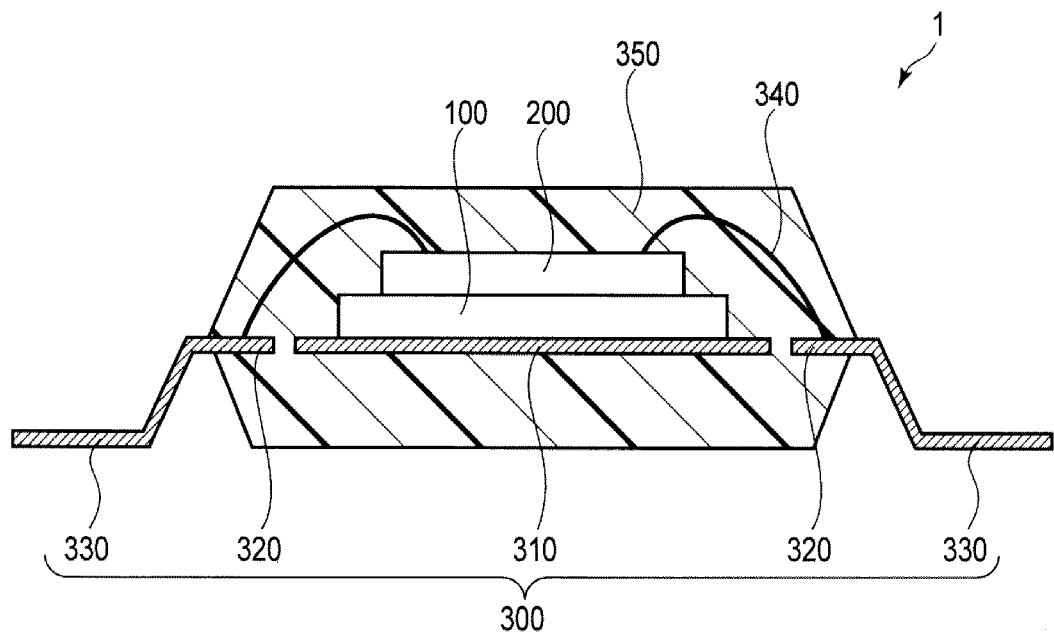
FIG. 2 is a cross-sectional view of the memory system.

More specifically, as illustrated in FIG. 2, the memory chip 100 is mounted on a die pad 310 of the lead frame 300, and the controller chip 200 is superposed on the memory chip 100.

The controller chip 200 is connected to an inner lead 320 of the lead frame via, for example, a bonding wire 340, and is also connected to the memory chip 100 via a bonding wire (not illustrated). The memory chip 100, the controller chip 200, the die pad 310, the inner lead 320, and the bonding wire 340 are sealed with, for example, the resin 350.

The inner lead 320 is connected to an outer lead 330 which is exposed to the outside of the resin 350. The outer lead 330 functions as an external connection terminal (external connection pin) of the memory system 1. In FIG. 1, sixteen external connection terminals, including first to sixteenth pins, are provided. The memory system 1 performs communication with a host apparatus which controls the memory system 1 (more specifically, accesses the memory chip) via the pins.

FIG. 3 illustrates functions of the respective pins. As illustrated, the first pin is used to receive a control signal /HOLD, or to output serial data SO3. The control signal /HOLD is asserted (has an "L" level) when communication between the host apparatus and the memory system 1 is temporarily stopped. The second pin receives a power supply voltage Vcc. The third to sixth pins and the eleventh to fourteenth pins are reserved pins, and may be used, for example, when a certain signal or data are required to be transmitted and received in the future. The seventh pin receives a chip select signal /CS. The chip select signal /CS is a signal for activating the memory chip 100 and the controller chip 200 (in other words, a signal is asserted when accessing the memory system 1), and is asserted (has an "L" level), for example, at a timing at which the host apparatus inputs a command to the memory system 1. The eighth pin is used to output serial data (SO or SO1). The ninth pin is used to receive a control signal /WP or to output serial data (SO2). The control signal /WP is a write protect signal, and is asserted (has an "L" level) when writing to the memory chip is inhibited. The tenth pin receives a reference potential Vss. The fifteenth pin is used to receive serial data (SI) or to output serial data (SO0). The sixteenth pin receives a serial clock signal SCK.

The pin configuration conforms to the serial peripheral interface (SPI). The first pin, the eighth pin, the ninth pin, and the fifteenth pin are arbitrarily selected for use in outputting serial data, and can output data to the host apparatus at 1-time speed, 2-time speed, or 4-time speed.

FIG. 4 illustrates an example of a package configuration which is different from the one illustrated in FIG. 1. In FIG. 4, eight external connection terminals including first to eighth pins are provided. FIG. 5 illustrates functions of the respective pins shown in FIG. 4.

As illustrated, the first pin receives the chip select signal /CS. The second pin outputs the serial data SO and SO1. The third pin receives the write protect signal /WP or outputs the serial data SO2. The fourth pin receives the reference potential Vss. The fifth pin receives the serial data SI or outputs the serial data SO0. The sixth pin receives the serial clock. The seventh pin receives the control signal /HOLD or outputs the serial data SO3. The eighth pin receives the power supply voltage Vcc. Also in this case, the pin configuration conforms to the SPI.

Figure 6:
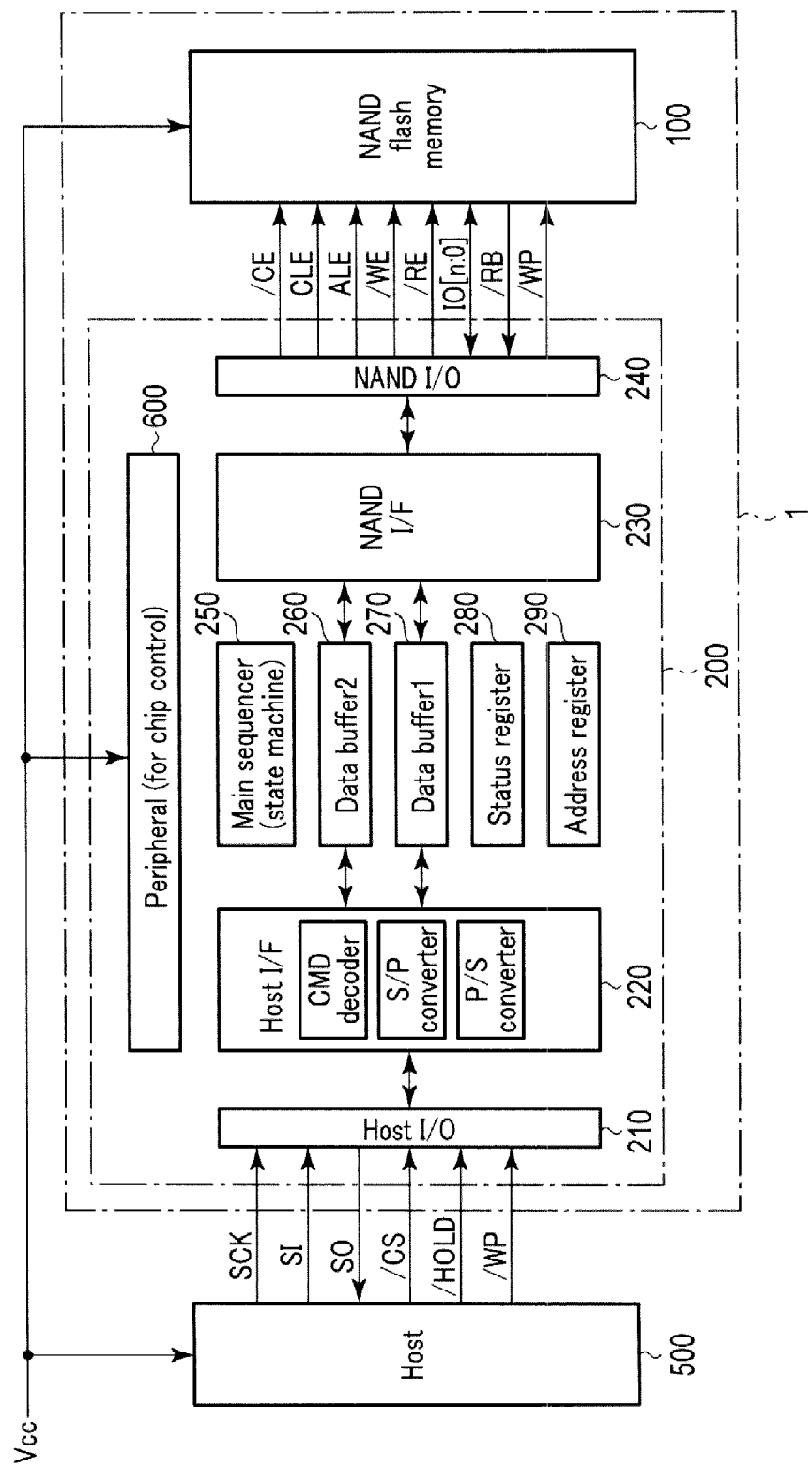
FIG. 6 is a block diagram of the memory system according to one or more embodiments.

FIG. 6 is a functional block diagram illustrating an internal configuration of the memory system 1. Hereinafter, the memory chip 100 is referred to as a NAND-type flash memory 100, and the controller chip 200 is simply referred to as a controller 200.

As illustrated, the memory system 1 includes the NAND-type flash memory 100 and the controller 200.

The NAND-type flash memory 100 includes a plurality of memory cells and stores data in a nonvolatile manner. The controller 200 is connected to the NAND-type flash memory 100 via NAND buses, and is connected to a host apparatus 500 via SPI buses. The controller 200 controls access to the NAND-type flash memory 100.

Each of the NAND buses performs transmission and reception of signals based on a NAND interface protocol. Specific examples of the signals include a chip enable signal /CE, an address latch enable signal ALE, a command latch enable signal CLE, a write enable signal /WE, a read enable signal /RE, a ready busy signal /RB, an input or output signal I/O, and a write protect signal /WP.

The signal /CE is asserted in a low level so as to activate the NAND-type flash memory 100, when accessing the NAND-type flash memory 100. The signals CLE and ALE are used to notify the NAND-type flash memory 100 that input signals I/O to the NAND-type flash memory 100 are respectively a command and an address. The signal /WE is asserted in a low level so that the input signal I/O is input to the NAND-type flash memory 100. The signal /RE is also asserted in a low level so that the output signal I/O is output from the NAND-type flash memory 100. The ready busy signal /RB indicates whether the NAND-type flash memory 100 is in a ready state (a state of being capable of receiving a command from the controller 200) or in a busy state (a state of being incapable of receiving a command from the controller 200), and a low level thereof indicates the busy state. The input or output signal I/O is, for example, an 8-bit (n=8) signal. The input or output signal I/O contains data which are transmitted and received between the NAND-type flash memory 100 and the controller 200, and includes a command, an address, data to be written, or read data. The signal /WP is a signal for inhibiting data from being written to the NAND-type flash memory 100.

The SPI buses are substantially similar to the ones described with reference to FIGS. 3 and 5.

0.1.2 Configuration of Controller 200

Next, with reference to FIG. 6, details of a configuration of the controller 200 will be described. As illustrated, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, and a peripheral circuit 600.

The host input/output circuit 210 functions as a buffer of signals which are transmitted to and received from the host apparatus 500. The signals SCK, SI, /CS, /HOLD and /WP are first received by the host input/output circuit 210 and are then output to the host interface circuit 220.

The host interface circuit 220 receives the signal SI in synchronization with the signal SCK. The host interface circuit 220 transmits the signal SO which is received in synchronization with the signal SCK, to the host apparatus 500 via the host input/output circuit 210.

The host interface circuit 220 controls transmission and reception of signals with the host apparatus 500 via the host input/output circuit 210. The host interface circuit 220 functions as a serial/parallel converter and a parallel/serial converter. For example, the input signal SI from the host apparatus 500 is converted from a serial signal into a parallel signal, and data read from the NAND-type flash memory 100 is converted from a parallel signal into a serial signal. If the input signal SI is a command, the host interface circuit 220 functions as a command decoder and decodes the received command. A decoded result is output to, for example, the sequencer 250.

The data buffers 260 and 270 temporarily holds data to be written that is received from the host apparatus 500, via the host interface circuit 220. Data read from the NAND-type flash memory 100 is received via the NAND interface circuit 230 and temporarily held.

The status register 280 holds various kinds of status information of the memory system 1. For example, a feature table (described below) is held.

The address register 290 holds an address received from the host apparatus 500, via the host interface circuit 220.

The NAND interface circuit 230 controls transmission and reception of signals to and from the NAND-type flash memory 100 via the NAND input/output circuit 240. The NAND interface circuit 230 issues various commands conforming to the NAND interface protocol in response to a command from the sequencer 250, and outputs the commands to the NAND-type flash memory 100 along with an address in the address register 290 via the NAND input/output circuit 240. During writing of data, the data in the data buffer 260 and/or 270 are output to the NAND-type flash memory 100 via the NAND input/output circuit 240. During reading of data, data read from the NAND-type flash memory 100 are transmitted to the data buffer 260 and/or 270.

The NAND input/output circuit 240 functions as a buffer of signals which are transmitted to or received from the NAND-type flash memory 100. The NAND input/output circuit 240 asserts or deasserts the signals /CE, CLE, ALE, /WE, /RE and /WP in response to commands from the NAND interface circuit 230. During reading of data, the NAND input/output circuit 240 temporarily holds a signal IO (read data) and transmits the signal to the NAND interface circuit 230. During writing of data, the NAND input/output circuit 240 temporarily holds a signal IO (data to be written) and transmits the signal to the NAND-type flash memory 100. The ready busy signal /RB is received from the NAND-type flash memory 100 and is transmitted to the NAND interface circuit 230.

The sequencer 250 controls the operation of the controller 200. For example, if a data reading request is received from the host apparatus 500, the sequencer 250 instructs the NAND interface circuit 230 to execute an operation for performing a reading operation. If a data writing request is received from the host apparatus 500, the sequencer 250 instructs the NAND interface circuit 230 to execute an operation for performing a writing operation. The feature table in the status register 280 is updated based on status information received from the NAND-type flash memory 100.

The peripheral circuit 600 receives the power supply voltage Vcc from an external device, transmits the voltage to each circuit block, and performs other control which is necessary in an operation of the controller 200.

0.1.3 Configuration of NAND-Type Flash Memory 100

Figure 7:
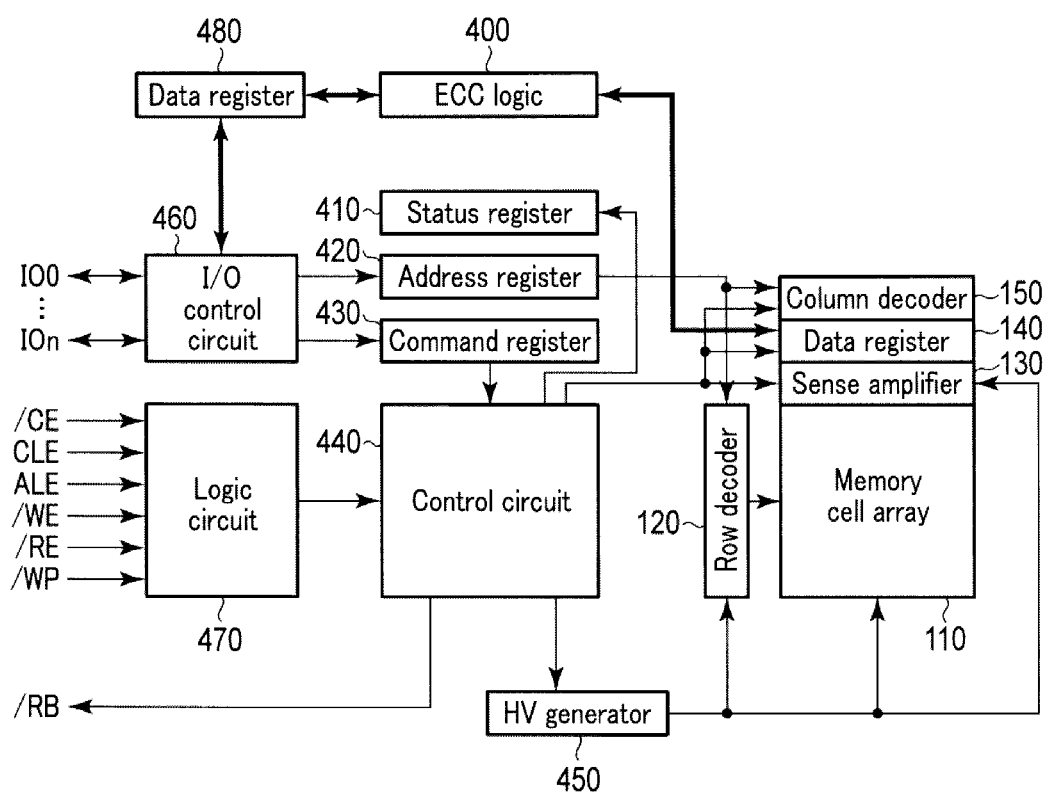
FIG. 7 is a block diagram of a semiconductor memory device according to one or more embodiments.

Next, with reference to FIG. 7, a configuration of the NAND-type flash memory 100 will be described. FIG. 7 is a block diagram of the NAND-type flash memory 100.

As illustrated, the NAND-type flash memory 100 includes a memory cell array 110, a row decoder 120, a sense amplifier 130, a data register 140, a column decoder 150, an error correction code (ECC) circuit 400, a status register 410, an address register 420, a command register 430, a control circuit 440, a voltage generation circuit 450, an input/output control circuit 460, a logic circuit 470, and a data register 480.

The memory cell array 110 includes a plurality of non-volatile memory cells arranged in rows and columns. Memory cells in the same row are connected to the same word line, and memory cells in the same column are connected to the same bit line. Reading and writing of data are collectively performed on a plurality of memory cells connected to the same word line. This unit of reading and writing data is referred to as a page. Data corresponding to one page includes net data and management data. The net data are managed in the unit called a sector. For example, in the present embodiment, one page includes four sectors, and each sector has a data size of 512 bytes. The management data include, for example, ECC data (parity) for correcting errors. The error correction is performed on a per sector basis. Therefore, the management data includes ECC data which are prepared for one sector. Erasing of data is collectively performed in units of a plurality of pages, referred to as a block.

The row decoder 120 decodes a row address for designating a row of the memory cell array 110. A word line is selected based on a decoded result, and voltages which are required to write, read, and erase data are applied thereto.

During reading of data, the sense amplifier 130 senses data read from the memory cell array 110 and transmits the data to the data register 140. During writing of data, data in the data register 140 are transmitted to the memory cell array 110.

The data register 140 temporarily holds data to be written or read data corresponding to one page.

The column decoder 150 decodes a column address of a column of the memory cell array 110. Based on a decoded result, data are transmitted to the data register 140 during writing of data, and data are read from the data register 140 during reading of data.

The ECC circuit 400 performs error detection and error correction processes. More specifically, during writing of data, the ECC circuit 400 generates parity for each sector based on data received from the controller 200, and transmits the parity and net data to the data register 140. During reading of data, the ECC circuit 400 generates a syndrome for each sector based on parity included in data transmitted from the data register 140, and detects the presence or absence of an error. If an error is detected, a bit position thereof is specified, and the error is corrected. The number of error bits which can be corrected for each sector is, for example, 8 bits per sector in the present embodiment. The ECC circuit 400 may output the number of error bits detected in each sector to the status register 410 as status information.

The logic circuit 470 receives the signals /CE, CLE, ALE, /WE, /RE, and /WP from the controller 200.

The input/output control circuit 460 receives a signal IO [n:0]. If the signal IO is an address (if ALE="H"), the input/output control circuit 460 holds the address in the address register 420. If the signal IO is a command (if CLE="H"), the command is held in the command register 430. If the signal IO is data (if ALE=CLE="L"), the data are held in the data register 480.

The status register 410 holds various kinds of status information of the NAND-type flash memory 100. The status information includes information indicating the number of error bits provided from the ECC circuit 400, and information indicating whether or not a writing operation and a reading operation is successful (passed) or unsuccessful (failed), provided from the control circuit 440.

The control circuit 440 controls the NAND-type flash memory 100 based on commands held in the command register 430 and various signals input to the logic circuit 470. The control circuit 440 generates the ready busy signal /RB and outputs the signal to the controller 200.

The voltage generation circuit 450 generates voltage required in data writing, reading, and erasing operations based on a command from the control circuit 440, and supplies the voltages to the memory cell array 110, the row decoder 120, and the sense amplifier 130.

0.2 Operations

Next, data reading, writing, and erasing operations in the memory system according to the present embodiment will be described, focusing on signals which are transmitted and received via the SPI buses and the NAND buses.

0.2.1 Reading Operation

First, the reading operation will be described. The reading operation includes the following three steps.

(1) Reading of data from the NAND-type flash memory: Through this step, data are read from the NAND-type flash memory 100 to the controller 200.

(2) Feature table reading (referred to as Get feature in some cases): Through this step, whether the memory system 1 is in a busy state or a ready state is determined, that is, whether or not the operation in the step (1) is completed is determined.

(3) Reading of data from the controller 200: Through this step, the data read to the controller 200 in the above (1) are read to the host apparatus 500.

Figure 8:
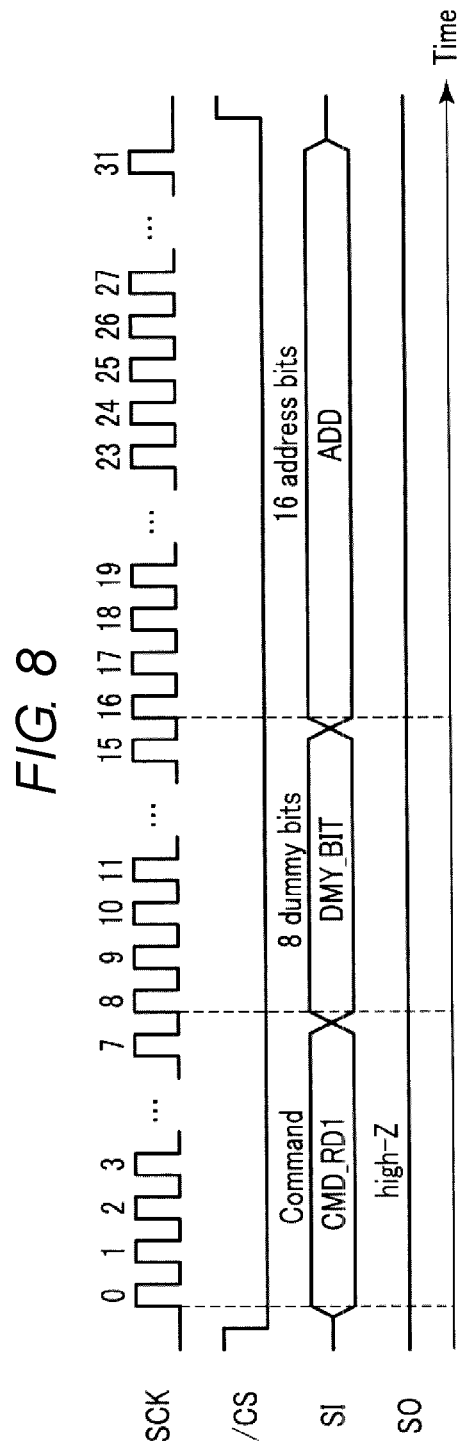
FIGS. 8-11 are timing charts of various signals during reading of data in the memory system according to one or more embodiments.

FIG. 8 is a timing chart of various signals on the SPI buses during execution of the step (1). As illustrated, the host apparatus 500 asserts the signal /CS, issues a first read command CMD_RD1 as the signal SI, and also issues the clock SCK.

The host interface circuit 220 of the controller 200 recognizes the signal SI when the signal /CS is asserted and the initial clock SCK is received, as a command. The command is, for example, an 8-bit signal which is input for 8 clock cycles. The first read command CMD_RD1 is received, and then the sequencer 250 starts a data reading sequence.

Next, the host apparatus 500 transmits dummy bits DMY_ BIT to the controller 200, for example, for 8 clock cycles, and then transmits an address ADD to the controller 200, for example, for 16 clock cycles. After the address ADD is transmitted, the host apparatus 500 deasserts the signal /CS. The address ADD is an address for designating a block and a page in the NAND-type flash memory 100, and is held in the address register 290.

As described above, when a specific command is received, what kind of signal is subsequently input (command sequence) is defined in advance. In other words, for example, if the first read command CMD_RD1 is received, the controller 200 recognizes that the signal SI which is input for subsequent 8 clock cycles is meaningless dummy data, and the signal SI which is input in subsequent 16 clock cycles is an address signal.

Figure 9:
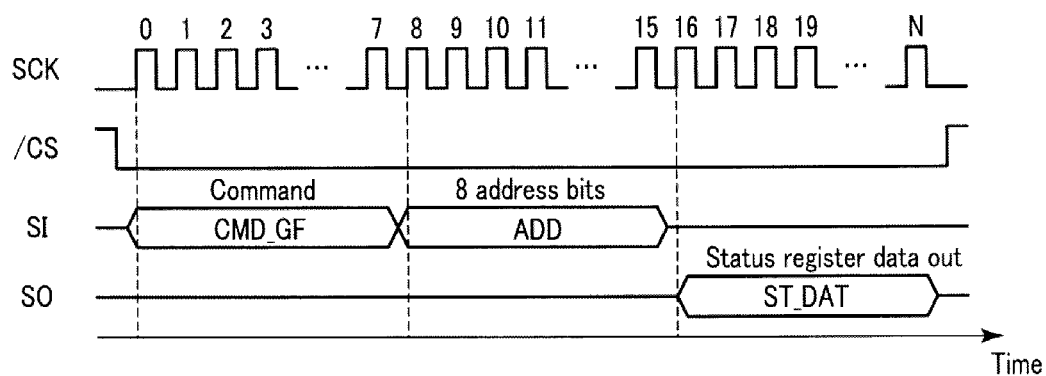

The operation in the step (2) is performed following the operation in the step (1). FIG. 9 is a timing chart of various signals on the SPI buses during execution in the step (2). As illustrated, the host apparatus 500 asserts the signal /CS again, issues a Get feature command CMD_GF as the signal SI, and also issues the clock SCK.

Next, the host apparatus 500 transmits an address ADD to the controller 200, for example, for 8 clock cycles. The address ADD is in the feature table, and naturally designates a region in which ready busy information is stored. In the controller 200, after the address ADD is received, the host interface circuit 220 reads an entry designated in the feature table from the status register 280 in response to a command from the sequencer 250, and transmits the entry to the host apparatus 500 as 8-bit status data ST_DAT for 8 clock cycles. The status data ST_DAT includes the ready busy information. After the status data ST_DAT is received, the host apparatus 500 deasserts the signal /CS.

Figure 10:
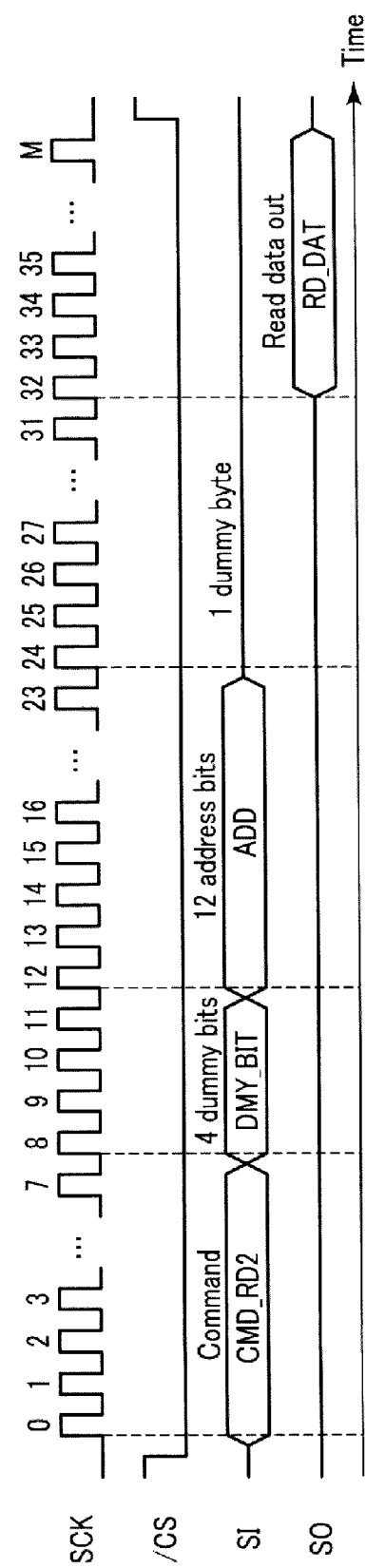

If the received status data ST_DAT indicates that the memory system 1 is in a ready state, the operation in the step (3) is performed. FIG. 10 is a timing chart of various signals on the SPI buses during execution of the step (3). As illustrated, the host apparatus 500 asserts the signal /CS, issues a second read command CMD_RD2 as the signal SI, and also issues the clock SCK.

Next, the host apparatus 500 transmits dummy bits DMY_ BIT to the controller 200, for example, for 4 clock cycles, and then transmits an address ADD to the controller 200, for example, for 12 clock cycles. The address ADD designates a region in the data buffer 260 or 270 of the controller 200, and designates a column of a page in the NAND-type flash memory 100. The address ADD is held in the address register 290. Then, the host interface circuit 220 reads data from the data buffer 260 or 270, for example, under the control of the sequencer 250. After the 8 clock cycles, the host interface circuit 220 transmits the data RD_DAT read from the data buffer 260 or 270 to the host apparatus 500.

Figure 11:
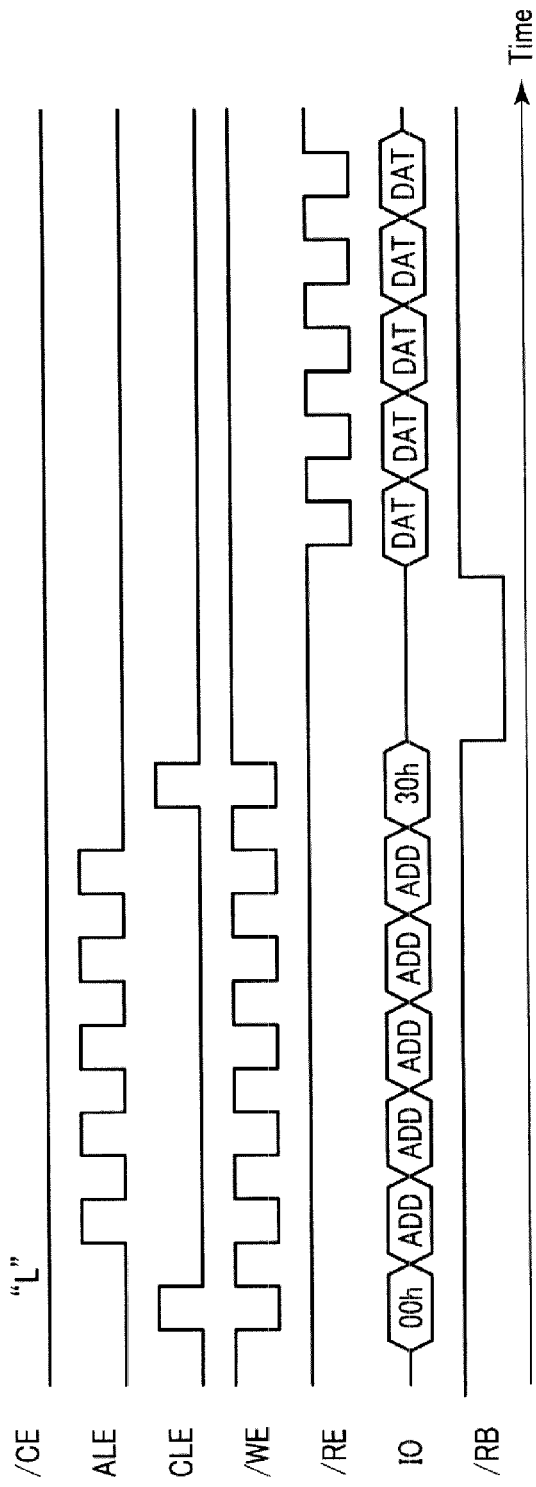

FIG. 11 is a timing chart of various signals on the NAND bus during execution of the step (1). After the first read command CMD_RD1 is received in the controller 200, the NAND interface circuit 230 issues an address input command "00h", for example, under the control of the sequencer 250, and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 8 and 10.

An operation of reading data from the memory cell array 110 is started in the NAND-type flash memory 100 in response to the command "30h", and thus the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

0.2.2 Writing Operation

Next, the writing operation will be described. The writing operation includes the following three steps.

(1) Transmission of data from the host apparatus 500 to the controller 200

(2) Writing of the transmitted data to the NAND-type flash memory 100

(3) Feature table reading (Get feature): Through this step, whether writing of the data to the NAND-type flash memory 100 is passed or failed is determined.

Figure 12:
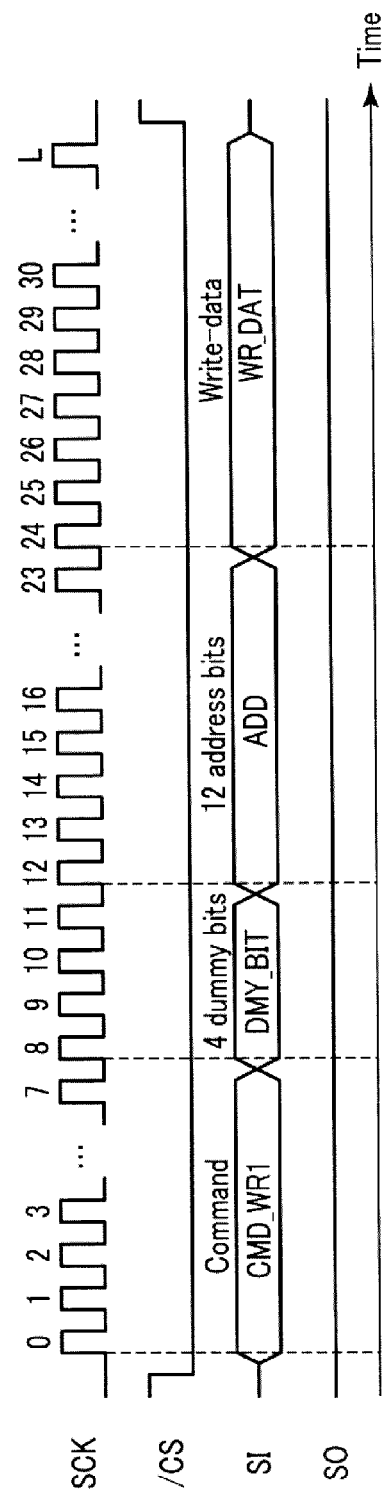
FIGS. 12-14 are timing charts of various signals during writing of data in the memory system according to one or more embodiments.

FIG. 12 is a timing chart of various signals on the SPI buses during execution of the step (1). As illustrated, the host apparatus 500 asserts the signal /CS, issues a first write command CMD_WR1 as the signal SI, and also issues the clock SCK. If the first write command CMD_WR1 is received, the sequencer 250 starts a data writing sequence.

Next, the host apparatus 500 transmits dummy bits DMY_ BIT to the controller 200, for example, for 4 clock cycles, and then transmits an address ADD to the controller 200, for example, for 12 clock cycles. The address ADD designates a region in the data buffer 260 or 270, and designates a column of a page in the NAND-type flash memory 100. The address ADD is held in the address register 290. The host apparatus 500 transmits data to be written WR_DAT to the controller 200. The data to be written WR_DAT are held in the region corresponding to the address ADD received immediately before, in the data buffer 260 or 270. After the data WR_DAT is transmitted, the host apparatus 500 deasserts the signal /CS.

Figure 13:
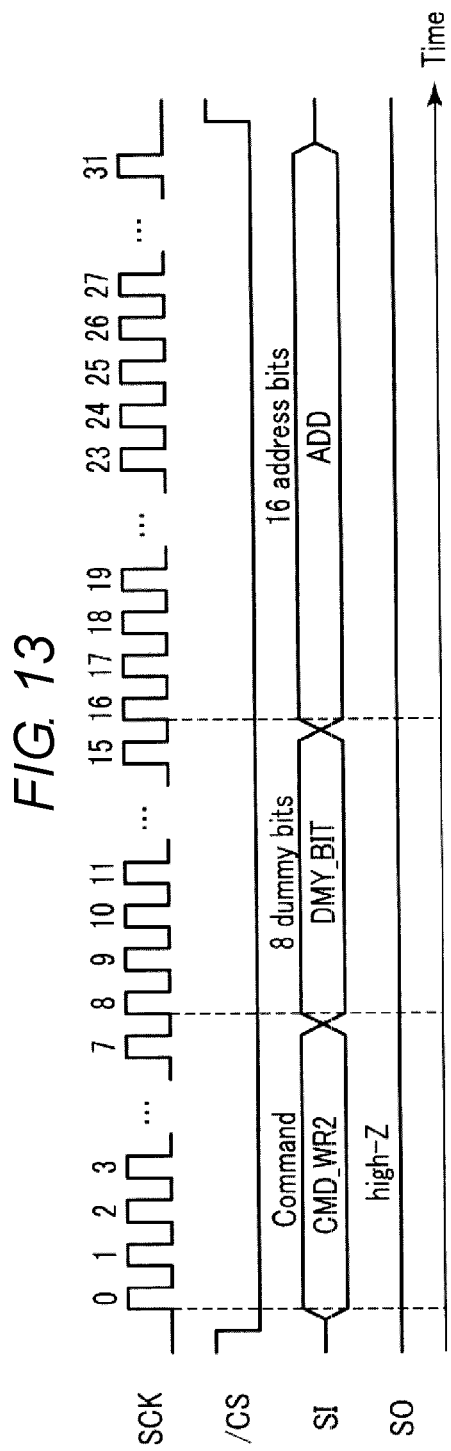

The step (2) is performed following the step (1). FIG. 13 is a timing chart of various signals on the SPI bus during execution of the step (2). As illustrated, the host apparatus 500 asserts the signal /CS again, issues a second write command CMD_WR2 as the signal SI, and also issues the clock SCK. If the second write command CMD_WR2 is received, the sequencer 250 recognizes that a command for the step (2) is received.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates a block and a page in the NAND-type flash memory 100, and is held in the address register 290. After the address ADD is transmitted, the host apparatus 500 deasserts the signal /CS.

The step (3) is performed following the step (2). A command sequence in this operation is the same as in FIG. 9 referred to for description of the reading operation. If the received status data ST_DAT indicates that the memory system 1 is in a ready state, the host apparatus 500 subsequently makes a request for information indicating whether writing of data is passed or failed.

Figure 14:
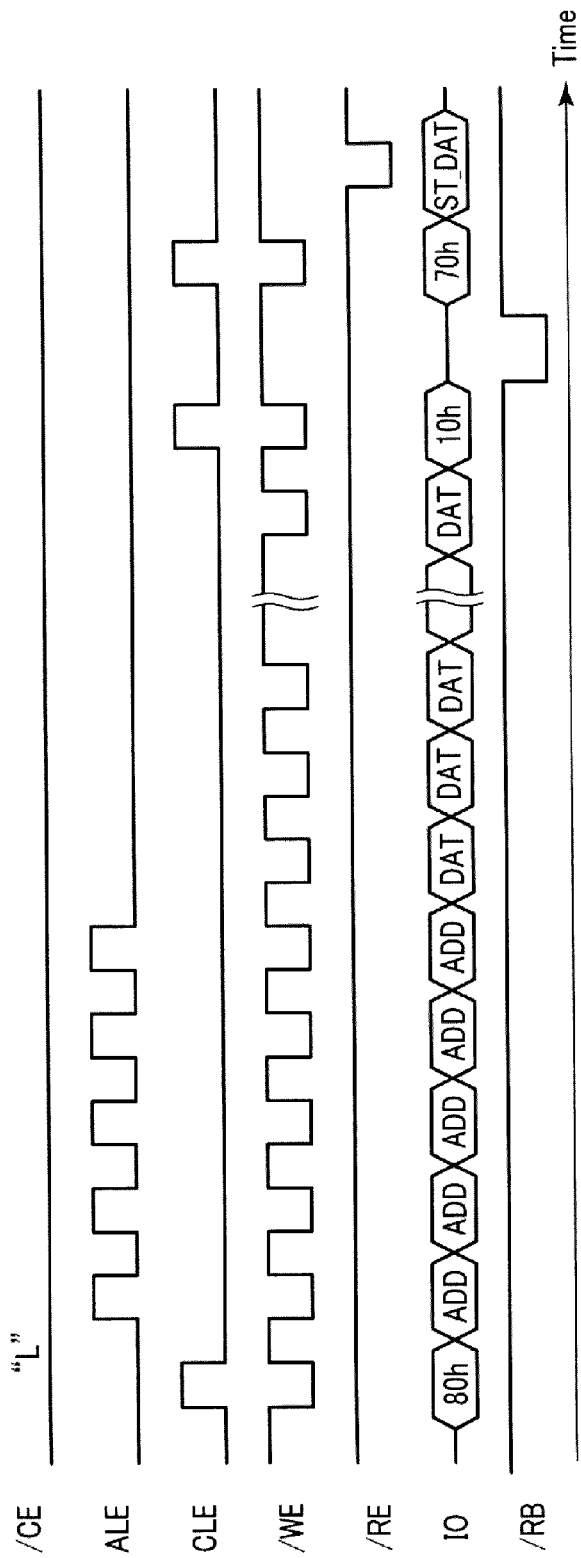

FIG. 14 is a timing chart of various signals on the NAND buses during execution of the step (2). After the second write command CMD_WR2 is received in the controller 200, the NAND interface circuit 230 issues a write command "80h", for example, under the control of the sequencer 250, and transmits the command to the NAND-type flash memory 100. Subsequently, an address ADD is transmitted to the NAND-type flash memory 100, for example, for 5 clock cycles, and data to be written DAT are transmitted to the NAND-type flash memory 100 for a plurality of clock cycles. Then, a write command "10h" is issued and is transmitted to the NAND-type flash memory 100. The address ADD includes addresses indicating a block, a page, and a column, held in the address register 290 in the operations illustrated in FIGS. 12 and 13.

An operation of writing the data to the memory cell array 110 is started in the NAND-type flash memory 100 in response to the command "10h", and thus the NAND-type flash memory 100 is brought into a busy state (/RB="L").

If writing of the data to the memory cell array 110 is completed, the NAND-type flash memory 100 is brought into a ready state. The controller 200 reads a status, issues a command "70h", and toggles the signal /RE, in response thereto. Then, status data ST_DAT indicating whether the writing operation is passed or failed is transmitted to the controller 200 in synchronization with the signal /RE. The status data ST_DAT is held in the feature table, and is read to the host apparatus 500 in response to the Get feature command in the step (3).

0.2.3 Erasing Operation

Next, the erasing operation will be described. The erasing operation includes the following two steps.

(1) An erase (delete) command is issued from the host apparatus 500 to the controller 200.

(2) Feature table reading (Get feature): Through this step, whether the erasing operation on the NAND-type flash memory 100 is passed or failed is determined.

Figure 15:
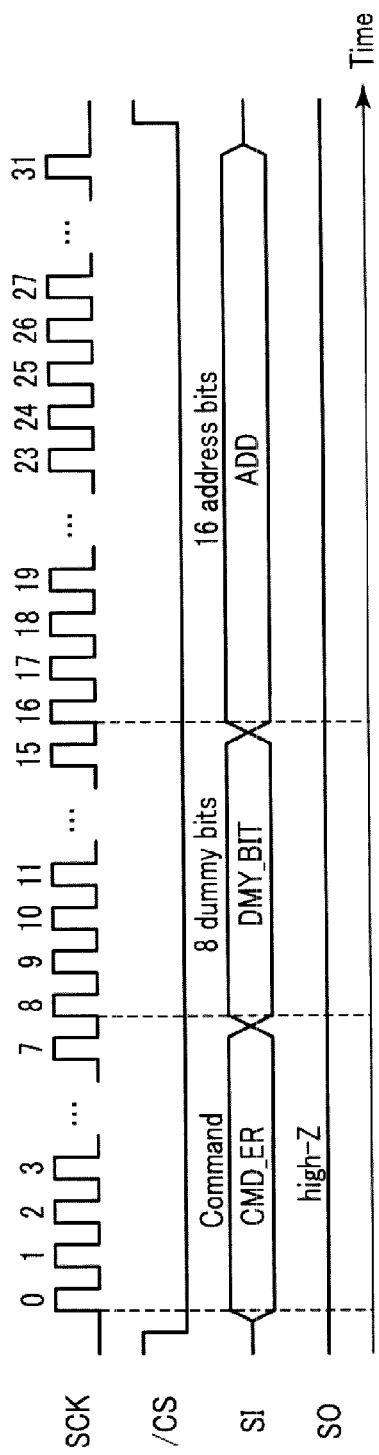
FIGS. 15-16 are timing charts of various signals during erasing of data in the memory system according to one or more embodiments.

FIG. 15 is a timing chart of various signals on the SPI buses during execution of the step (1). As illustrated, the host apparatus 500 asserts the signal /CS, issues an erase command CMD_ER as the signal SI, and also issues the clock SCK. If the erase command CMD_ER is received, the sequencer 250 starts a data erasure sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates an erasure target block in the memory cell array 110, and is held in the address register 290. Subsequently, the host apparatus 500 deasserts the signal /CS.

The step (2) is performed following the step (1). A command sequence in this operation is the same as in FIG. 9 referred to for description of the reading operation. If the received status data ST_DAT indicates that the memory system 1 is in a ready state, the host apparatus 500 subsequently makes a request for information indicating whether erasure of the data is passed or failed.

Figure 16:
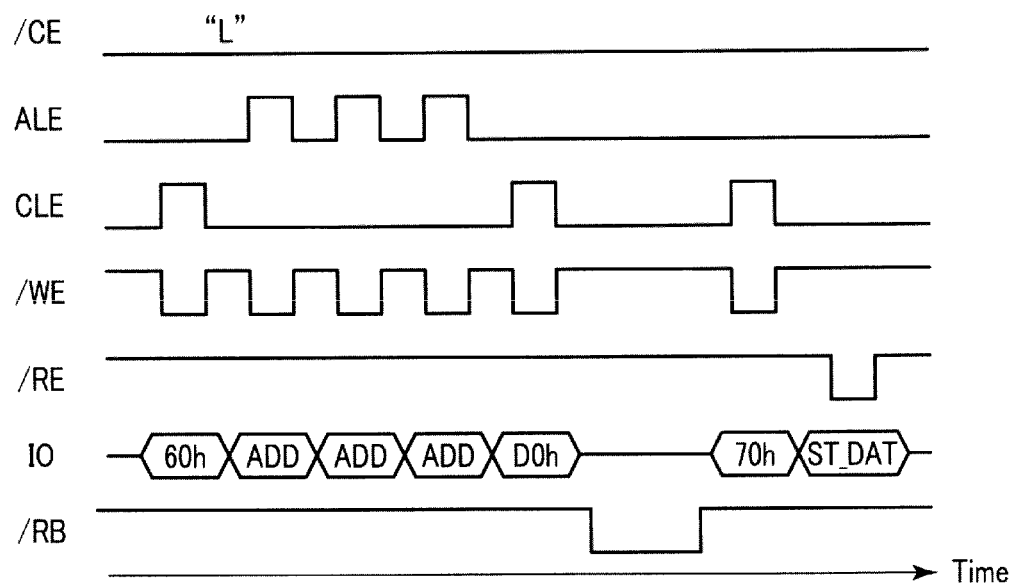

FIG. 16 is a timing chart of various signals on the NAND buses during execution of the step (1). After the erase command CMD_ER is received in the controller 200, the NAND interface circuit 230 issues a write command "60h", for example, under the control of the sequencer 250, and transmits the command to the NAND-type flash memory 100. Subsequently, an address ADD is transmitted to the NAND-type flash memory 100, for example, for 3 clock cycles, and then an erase command "D0h" is issued and is transmitted to the NAND-type flash memory 100.

An operation of erasing data from the memory cell array 110 is started in the NAND-type flash memory 100 in response to the command "D0h", and thus the NAND-type flash memory 100 is brought into a busy state (/RB="L").

If erasing of the data from the memory cell array 110 is completed, the NAND-type flash memory 100 is brought into a ready state. The controller 200 issues a status read command "70h", and toggles the signal /RE, in response thereto. Then, status data ST_DAT indicating whether the erasing operation is passed or failed is transmitted to the controller 200 in synchronization with the signal /RE. The status data ST_DAT is held in the feature table, and is read to the host apparatus 500 in response to the Get feature command during the step (2).

The above description relates to the matter common to the memory systems according to the following embodiments. Next, matters which are specific to the memory systems according to each of exemplary embodiments will be described individually.

1. First Embodiment

1.1 Configuration of NAND-Type Flash Memory 100

Figure 17:
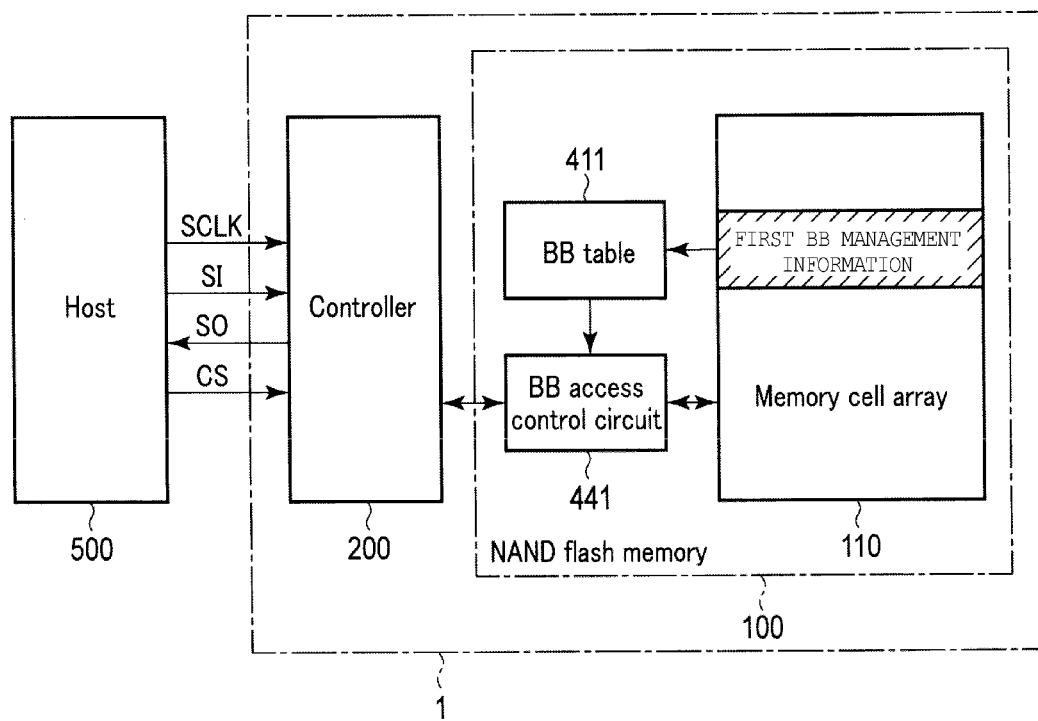
FIG. 17 schematically illustrates a memory system and a peripheral configuration thereof according to a first embodiment.
Figure 18:
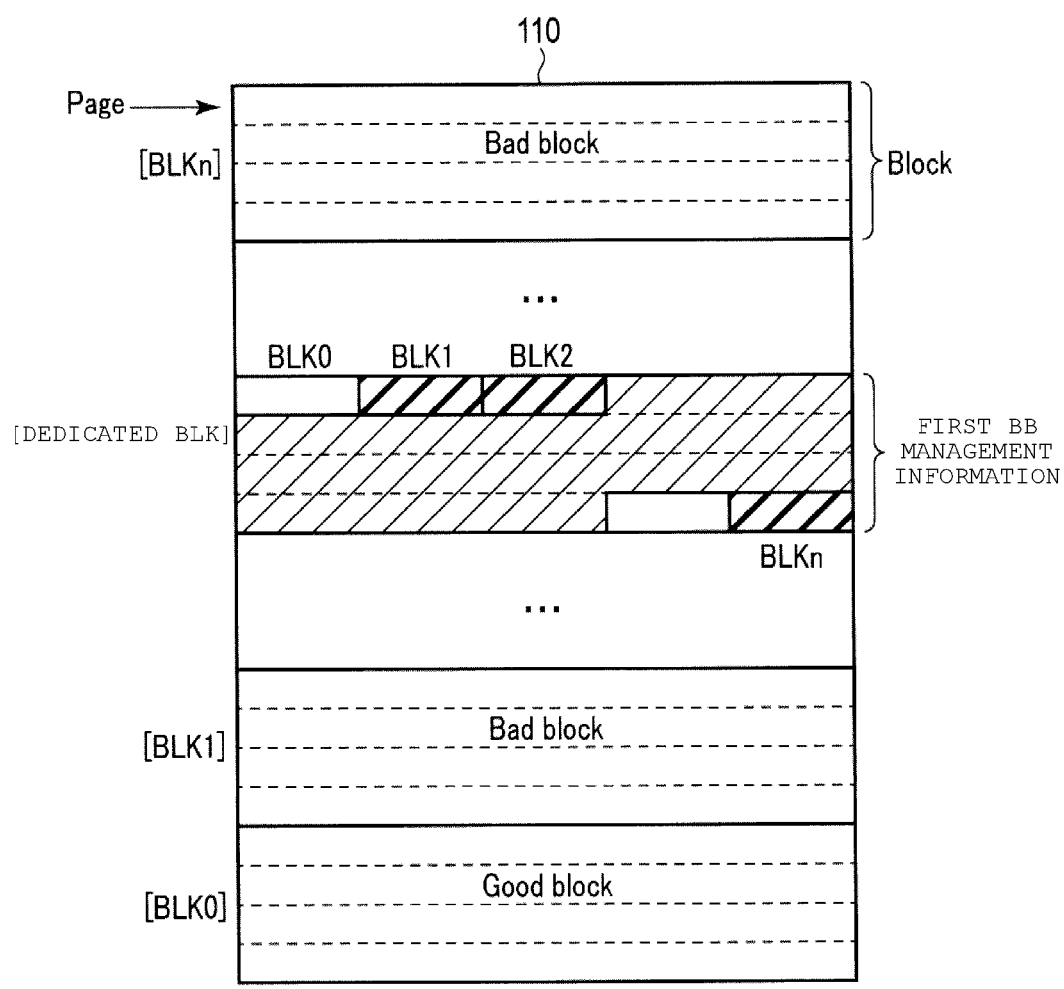
FIG. 18 schematically illustrates a configuration of a memory cell array according to the first embodiment.
Figure 19:
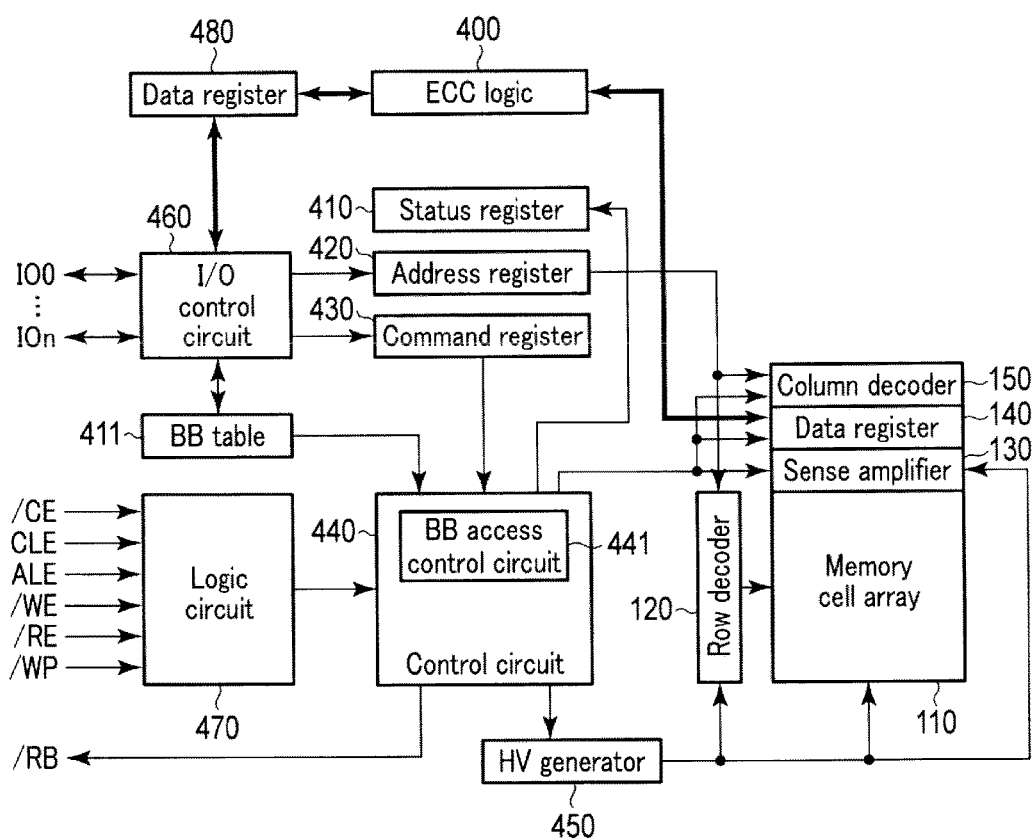
FIG. 19 is a block diagram of a NAND-type flash memory according to the first embodiment.

First, a configuration of the NAND-type flash memory 100 according to a first embodiment will be described with reference to FIGS. 17 to 19. FIG. 17 illustrates a memory system and a peripheral configuration thereof according to the first embodiment, and FIGS. 18 and 19 illustrate configurations of the memory cell array and the NAND-type flash memory illustrated in FIG. 17. In FIGS. 17 to 19, the same reference numeral is used for substantially same components as in the drawings described above and detailed description thereof will be omitted, and different components will be focused and described mainly. The same applies hereafter, and repeated description will be omitted.

In the present embodiment, erasing and writing operations on a bad block (defective block) are inhibited, and a configuration of the NAND-type flash memory 100 is different from the configuration illustrated in FIG. 7. Specifically, in the NAND-type flash memory 100, first BB management information is written into a dedicated block (first area) of the memory cell array 110 in advance. In addition, the NAND-type flash memory 100 includes a bad block table 411 and a bad block access control circuit 441. Hereinafter, a bad block is abbreviated to BB. For example, the bad block table 411 is also referred to as the BB table 411, and the block access control circuit 441 is also referred to as the BB access control circuit 441. For better understanding, the NAND-type flash memory 100 illustrated in FIG. 17 is illustrated by simplifying the NAND-type flash memory 100 illustrated in FIG. 19.

Figure 20:
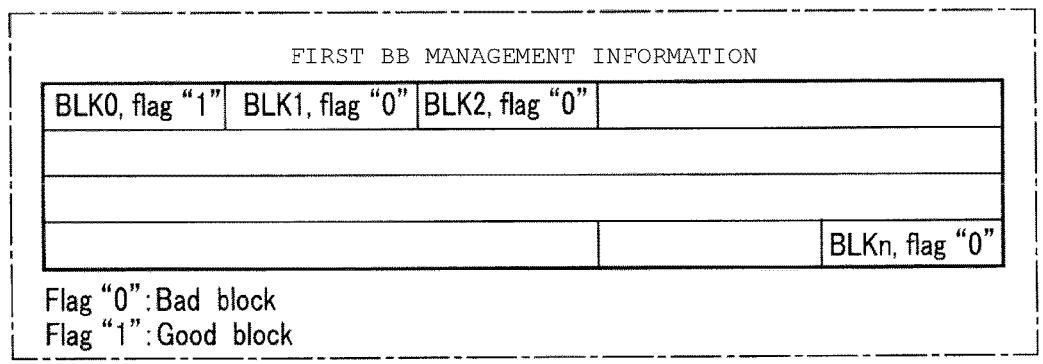
FIG. 20 schematically illustrates first bad block management information according to the first embodiment.

Here, the memory cell array 110 includes a plurality of blocks each having a memory cell which can store data. First bad block management information (first BB management information, block status data) indicating a bad block (defective block) among the plurality of blocks is written into the first area in advance. The first bad block management information indicates an inherent bad block which is present at the time of product shipment, and includes block information and flag information for each block as illustrated in FIG. 20. The block information identifies a block, and, for example, a block number or an address is used. In FIG. 20, as the block information, block numbers BLK0, BLK1, . . . , and BLKn are used. The flag information indicates a bad block, and, in this example, a value of "0" indicates a bad block, and a value of "1" indicates a good block (non-defective block).

The BB table 411 includes table data in which the first BB management information is described as illustrated in FIG. 21. The table data illustrated in FIG. 21 employs a format of the table, but the format of the first BB management information is not limited thereto, and may employ a format in which block information and flag information are described in a predetermined area of each block as illustrated in FIG. 20. The BB table 411 is not essential, and may be omitted if the BB access control circuit 441 refers to the first bad block management information in the memory cell array 110.

The BB access control circuit 441 is provided in the control circuit 440, for example, and functions as a cancel control circuit. Specifically, the BB access control circuit 441 has a function of canceling a command based on the first bad block management information if the command is a first inhibit command that instructs an erasing or writing operation on a bad block. If the BB table 411 is used, the BB access control circuit 441 cancels the first inhibit command based on the table data in the BB table 411. As the first inhibit command that instructs a writing operation, there are, for example, the write commands "80h" and "10h" illustrated in FIG. 14. As the first inhibit command that instructs an erasing operation, there is, for example, the erase command "60h" illustrated in FIG. 16.

1.2 Configuration of Controller 200

A configuration of the controller 200 is as illustrated in FIG. 6.

1.3 Operation

Next, with reference to flowcharts illustrated in FIGS. 22 to 25, an operation of canceling an inhibit command in the memory system according to the present embodiment will be described. The canceling operation is roughly performed as illustrated in FIG. 22, and includes three steps such as steps ST10 to ST30.

(Step ST10) writing of the first BB management information: If there is a block (an inherent bad block) which cannot be used at an initial state, the first BB management information is written into a dedicated block of the memory cell array during a shipment process of the memory system 1.

(Step ST20) reading of the first BB management information: The first BB management information is read from the dedicated block.

(Step ST30) Cancellation of an inhibit command: If an inhibit command for the bad block is issued from the host apparatus, the inhibit command for the bad block is canceled based on the first BB management information.

Hereinafter, the respective steps ST10 to ST30 will be described in detail.

Figure 23:
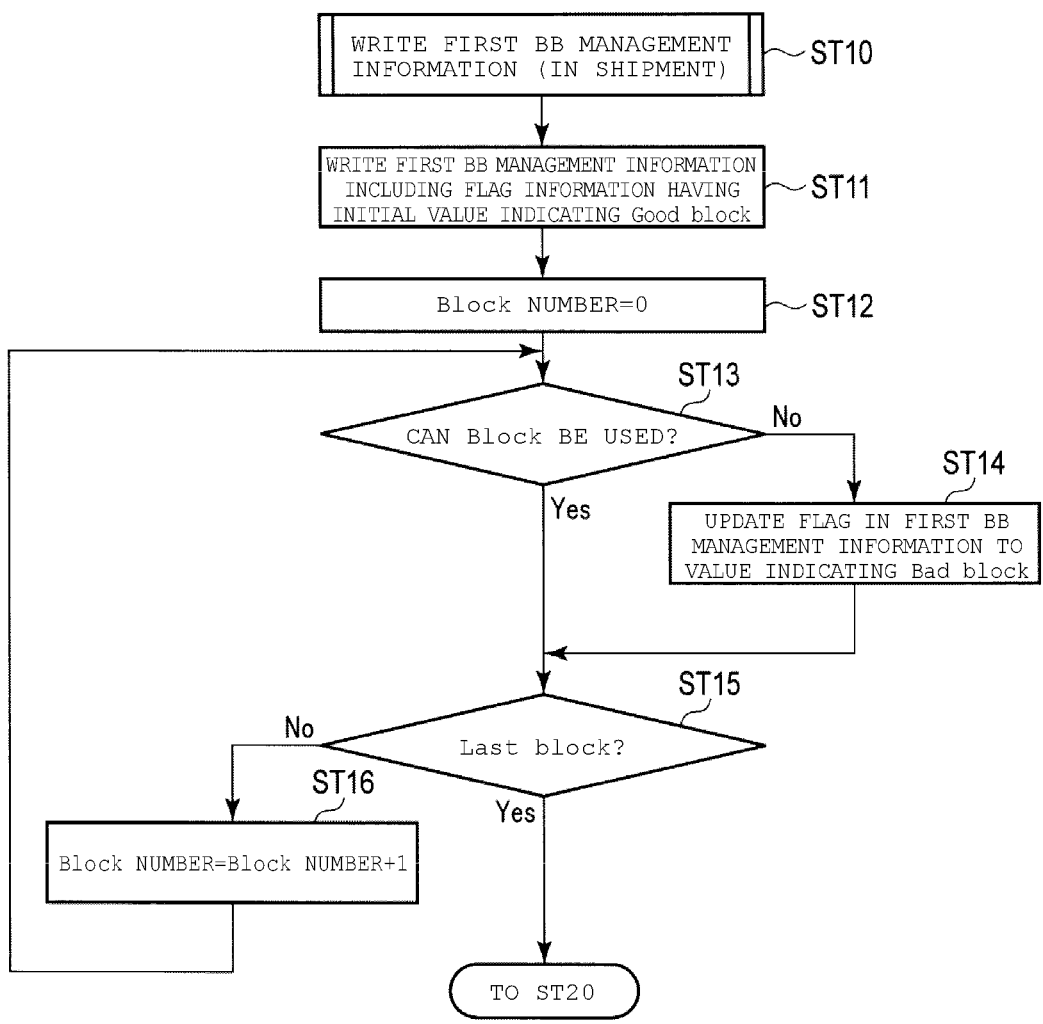

First, the first BB management information writing step ST10 will be described with reference to FIG. 23. The entire writing step ST10 illustrated in FIG. 23 is controlled by a tester (not illustrated). The tester may be implemented by a test circuit in the controller 200 or may be implemented by a host apparatus connected to the controller 200.

During the shipment process of the memory system 1, the first BB management information including flag information of the initial value "1" indicating a good block is written into a dedicated block BLK of the memory cell array 110 for each of the blocks BLK0, BLK1, . . . , and BLKn by the tester (step ST11).

Next, during the shipment process of the memory system 1, the tester tests each block. First, the tester starts testing each block by setting the block BLK0 with the block number "0" as a testing target (step ST12).

The tester performs a reading operation, a writing operation, and an erasing operation of data on the testing target block, and determines whether or not the block can be used depending on whether or not all the operations are normally completed (step ST13). As a result of the determination, if the block cannot be used, the initial value "1" of the flag information in the first BB management information is updated to the value "0" indicating a bad block (step ST14).

As a result of step ST13, if the block can be used, the tester determines whether or not the block is a last block based on the block number of the block (step ST15). If the block is not a last block as a determination result, the tester sets a block having a block number which is increased by +1 as a testing target (step ST16), and performs the process in step ST13 again.

If the block is a last block as a result of step ST15, the tester finishes a series of processes (ST11 to ST16) of step ST10.

Next, the first BB management information reading step ST20 will be described.

Figure 24:
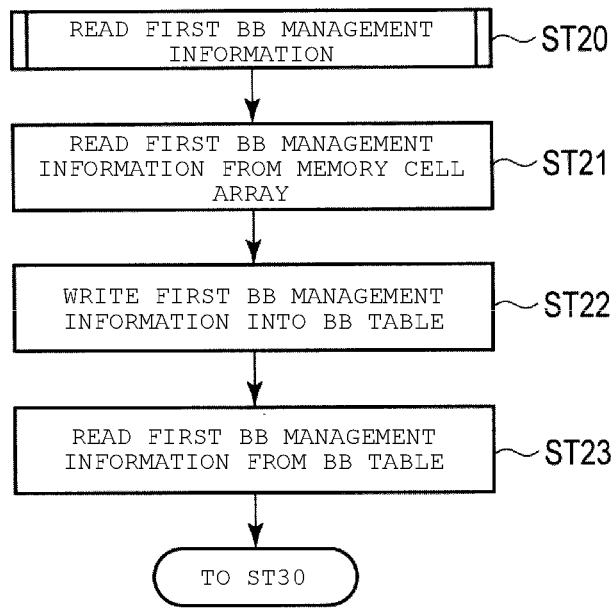

During use of the memory system 1, as illustrated in FIG. 24, the control circuit 440 reads the first BB management information from the memory cell array 110 (step ST21), and writes the first BB management information in the BB table 411 (step ST22).

Thereafter, the BB access control circuit 441 of the control circuit 440 reads the first BB management information from the BB table 411 (step ST23), and the process proceeds to step ST30.

Finally, the inhibit command cancellation step ST30 will be described.

Figure 25:
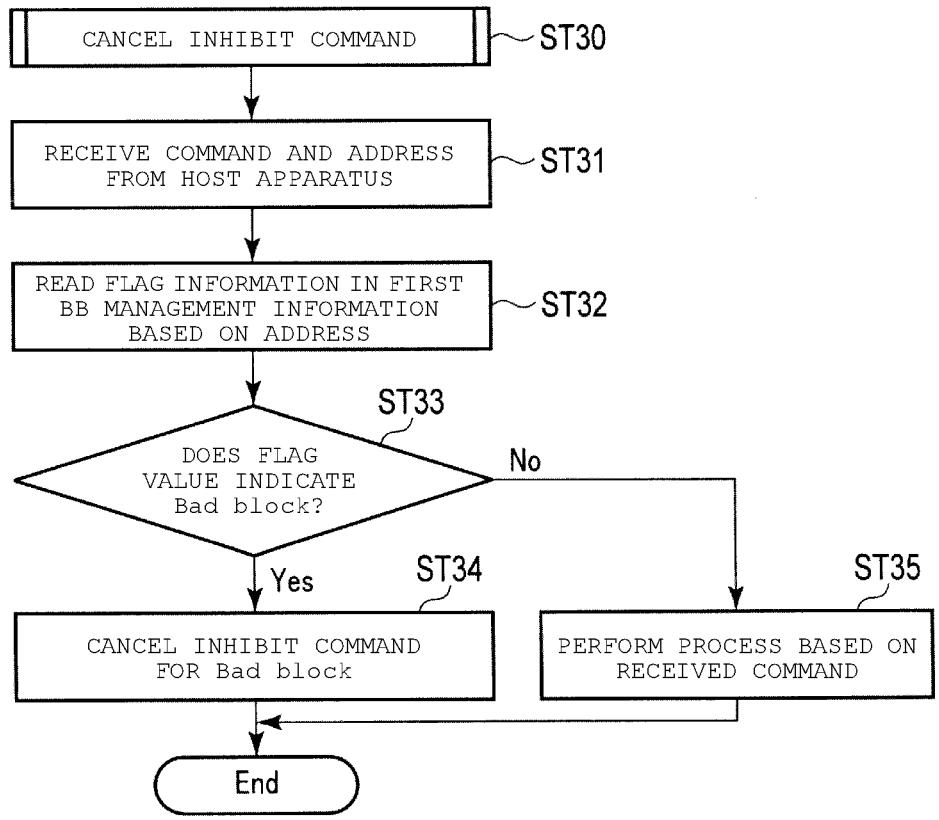

As illustrated in FIG. 25, the memory system 1 is assumed to receive a signal including a command and an address from the host apparatus 500 (step ST31). The controller 200 transmits the command and the address which are recognized based on the signal received in step ST31, to the NAND-type-flash memory 100 via the NAND bus.

The NAND-type flash memory 100 preserves the command and the address received via the NAND bus, in the command register 430 and the address register 420, respectively.

If the command is a first inhibit command for giving an instruction for an erasing or writing operation on the bad block, the BB access control circuit 441 cancels the first inhibit command based on the first BB management information (steps ST32 to ST34). Specifically, the BB access control circuit 441 reads flag information corresponding to a block number indicated by the address from the first BB management information based on the address in the address register 420 (step ST32). Subsequently, the BB access control circuit 441 determines whether or not a value of the flag information indicates the bad block (step ST33), and cancels the command in the command register 430 if the value indicates the bad block. Consequently, the BB access control circuit 441 cancels the first inhibit command for the bad block (step ST34). Here, if the first inhibit command is canceled, it indicates that a writing error or an erasing error occurs.

For this reason, the control circuit 440 returns status data indicating the writing error or erasing error to the host apparatus 500. Specifically, the control circuit 440 writes information indicating that the writing operation and the erasing operation are unsuccessful (failed) into the status register 410 as status data ST_DAT. As described above, the status data ST_DAT is transmitted to the controller 200. The status data ST_DAT is held in the feature table, and is read out to the host apparatus 500 by using the Get feature command.

On the other hand, if the value does not indicates the bad block as a determination result in step ST33, the control circuit 440 controls the NAND-type flash memory 100 to perform a process based on the command in the command register 430 (step ST35).

1.4 Advantage of Present Embodiment

Figure 26:
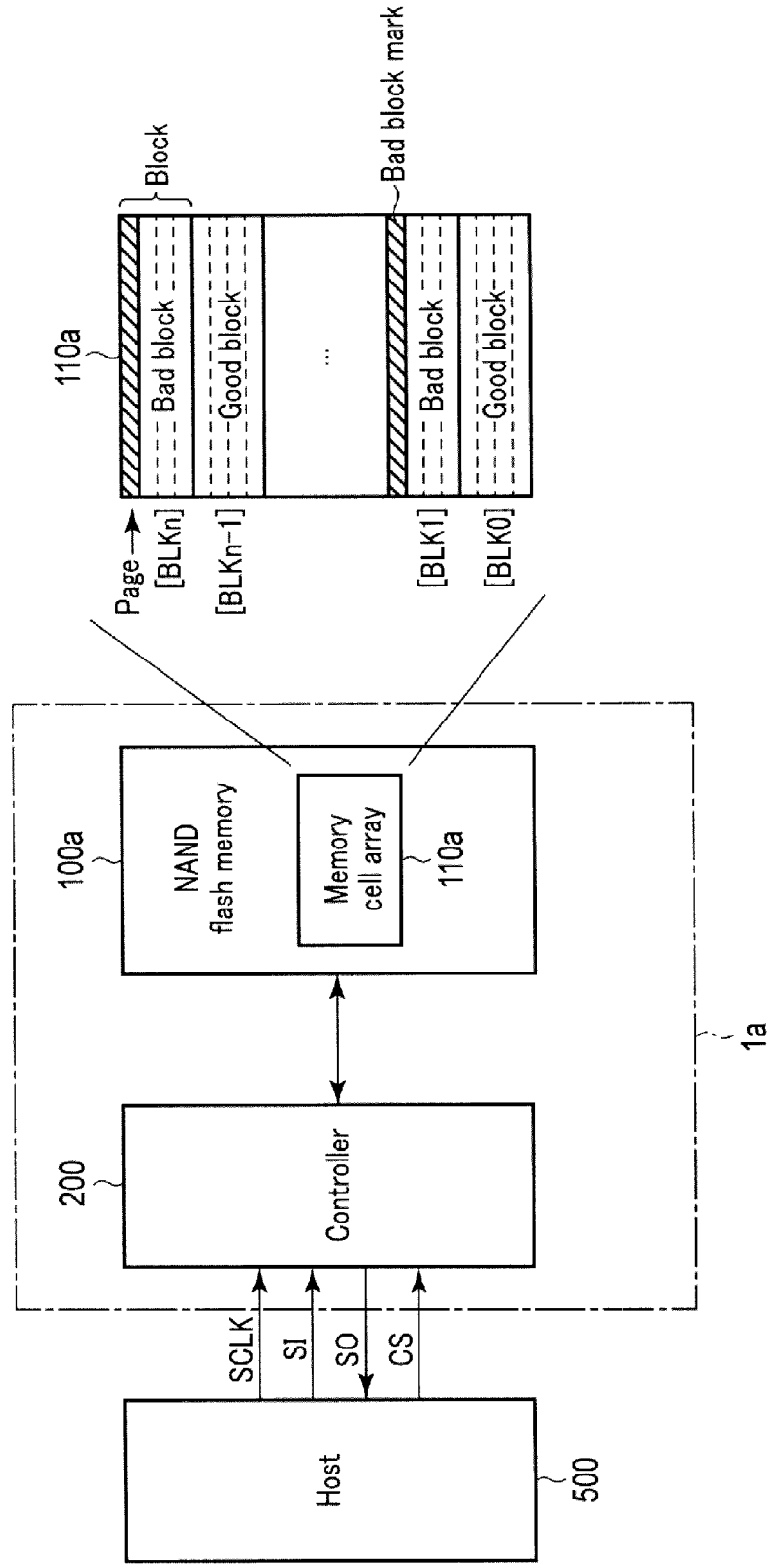
FIG. 26 schematically illustrates a memory system according to a comparative example of the first embodiment.

According to the present embodiment, an erasing operation and a writing operation on a bad block can be canceled. The advantage will be described below by using a memory system as illustrated in FIG. 26 as a comparative example.

As illustrated, since a plurality of blocks (bad blocks) which cannot be used are present in a NAND-type flash memory 100a at the time of testing conducted prior to shipment, a memory system 1a of the comparative example stores bad block information indicating the bad blocks. The bad block information is stored in a leading area (or a specific area of each page) of each block of a memory cell array 110a, and includes flag information indicating whether or not a block is a bad block. The flag information is also referred to as, for example, a bad block mark.

The bad block information is used to inhibit an erasing (Erase) and writing (Program) operations on the bad block. If the erasing and writing operations on the bad block are performed, the flag information in the bad block information is reversed, and thus the bad block information indicates the bad block as a valid block (good block).

As a comparative method of inhibiting erasing and writing operations on a bad block, there may be a method of controlling the host apparatus 500 with system software. According to the comparative method, the host apparatus 500 reads each block in the memory cell array 110a via the controller 200 before issuing a command (inhibit command) for performing an inhibited operation on a bad block. Here, if bad block information of a leading page of each block indicates a bad block, the host apparatus 500 cancels access to the bad block, and prevents the inhibit command for the bad block from being issued. As described above, according to the comparative method, the host apparatus 500 reads and checks the bad block information of the leading page of each block in advance and thus inhibits the erasing and writing operations on the bad block.

However, according to the comparative method, there is no particular problem at normal times, but, according to the examination of the present inventor, an inhibit command may be wrongly issued due to system software bugs or the like, and thus erasing and writing operations may be performed on a bad block.

In contrast, according to the present embodiment, even if the host apparatus 500 wrongly issues an inhibit command for a bad block, the memory system 1 cancels the inhibit command, and thus erasing and writing operations on the bad block can be prohibited. Along therewith, damage on the NAND-type flash memory 100 due to the erasing and writing operations on the bad block can be reduced.

In addition, according to the present embodiment, the host apparatus 500 does not need to read the bad block information, and thus improvement of system performance can be expected. Specifically, in the present embodiment, by managing the first BB management information including the bad block information in one specific area (dedicated block BLK), the number of times of reading the bad block information for acquisition can be reduced. In contrast, in the comparative method, the host apparatus 500 is required to read the bad block information of the leading page of each block, and thus system performance may be degraded.

In the present embodiment, since the bad block information of the leading page of each block is not used, the bad block information of the leading page of each block is omitted.

However, in the present embodiment, the bad block information of the leading page of each block may be included in consideration of a recovery operation when the dedicated block BLK storing the first BB management information is damaged. In this case, for example, good block information may be written into the leading page of each block during step ST11, and the good block information of the leading page of a block which cannot be used may be updated to bad block information during step ST14. Here, the good block information is not essential and may thus be omitted. If the good block information is omitted, step ST11 may be omitted, and the bad block information may be written into the leading page of the block which cannot be used during step ST14.

2. Second Embodiment

Next, a memory system according to a second embodiment will be described. In the present embodiment, a command is canceled also if the command is for a block (acquired bad block, a block which cannot be used due to deterioration over time) that became a bad block subsequently to the product shipment. Hereinafter, only a difference from the first embodiment will be described.

2.1 Configuration of NAND-Type Flash Memory 100

Figure 27:
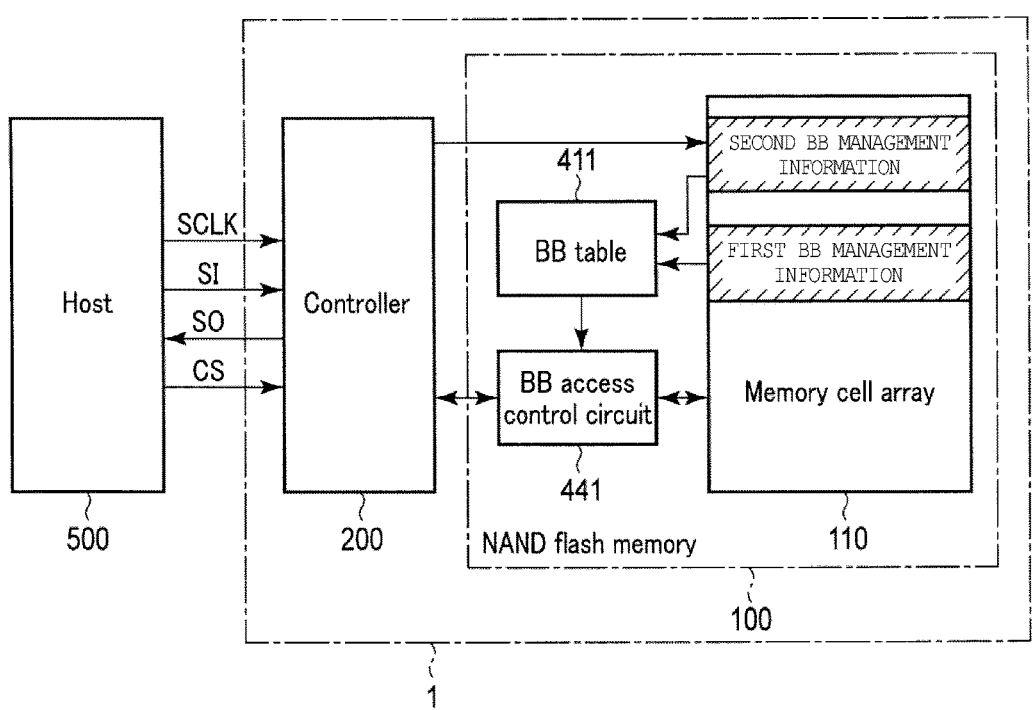
FIG. 27 schematically illustrates a memory system and a peripheral configuration thereof according to a second embodiment.
Figure 28:
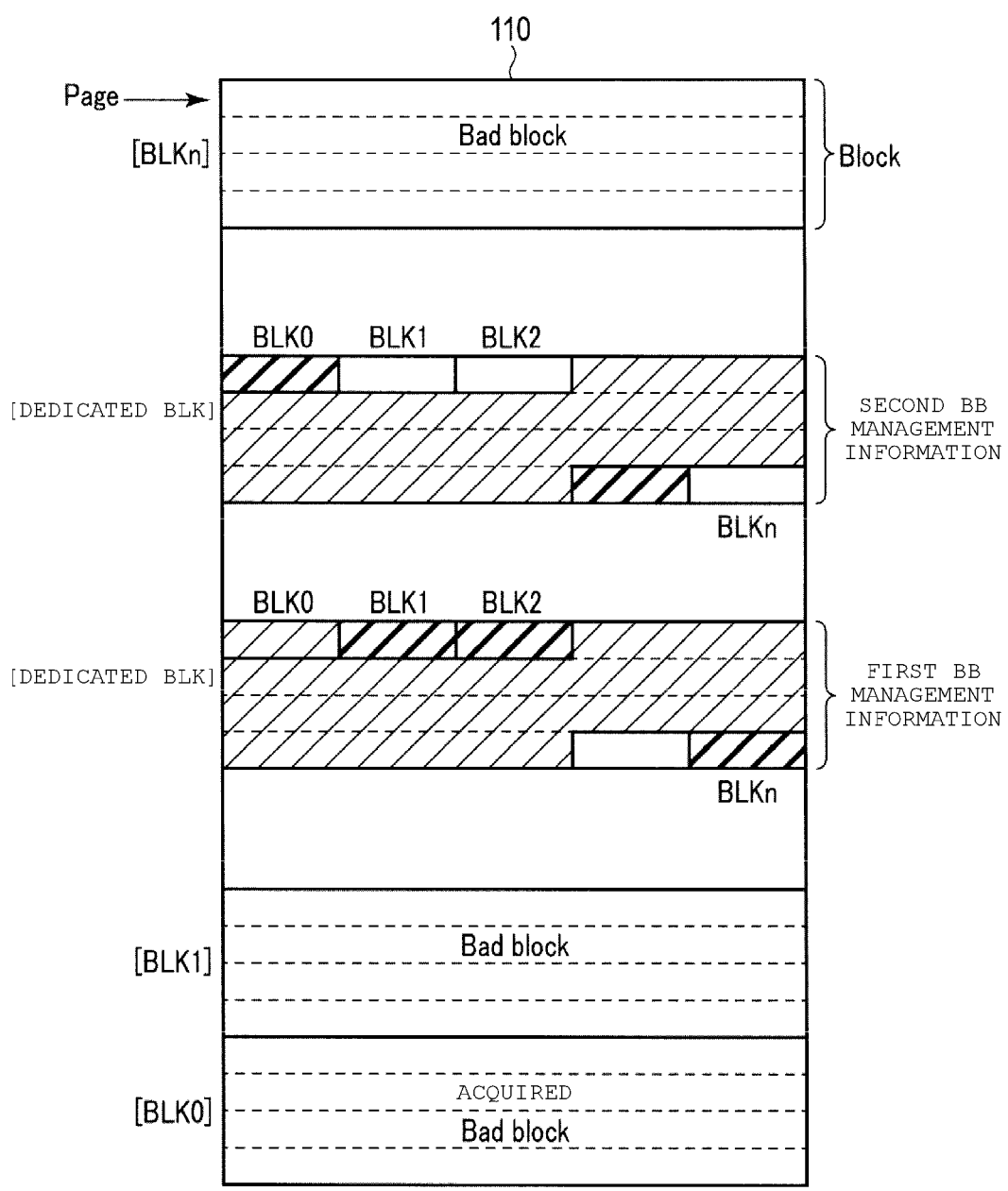
FIG. 28 schematically illustrates a configuration of a memory cell array according to the second embodiment.
Figure 29:
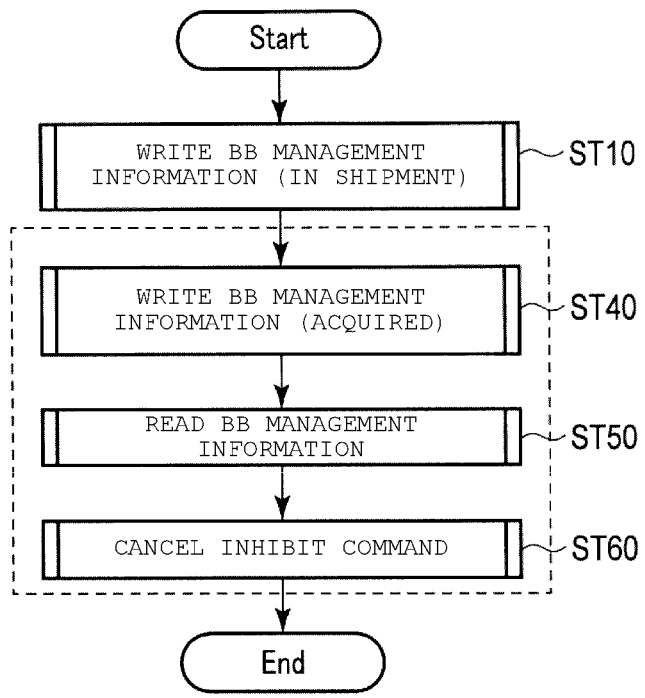
FIGS. 29-33 are flowcharts illustrating operations according to the second embodiment.

The memory cell array 110 includes, as illustrated in FIGS. 27 and 28, a dedicated block (second area) into which second bad block management information (hereinafter, referred to as second BB management information, second block status data) indicating an acquired bad block is written, as compared with the configuration illustrated in FIGS. 17 and 18. The first area into which the first BB management information is written and the second area into which the second BB management information is written are formed in different blocks of the memory cell array 110. Alternatively, the first area and the second area are not limited thereto and may be formed in the same block in the memory cell array 110. In other words, the first BB management information and the second BB management information may be written into the same block in the memory cell array 110. In this case, the second BB management information may be written, for example, by updating the flag information of the first BB management information in the dedicated block BLK illustrated in FIG. 18 from a value of a good block to a value of a bad block.

The BB table 411 includes table data in which the above-described first BB management information and the second BB management information of the present embodiment are described. The table data describes the first BB management information and the second BB management information according to the same configuration as the configuration illustrated in FIG. 21.

The BB access control circuit 441 has a function of canceling a command based on the second BB management information if the command is a second inhibit command that instructs an erasing or writing operation on an acquired bad block, in addition to the above-described function. If the BB table 411 is used, the BB access control circuit 441 has a function of separately canceling the first inhibit command and the second inhibit command based on the table data in the BB table 411.

Here, the acquired bad block is a block which is determined as being incapable of being used since errors occur during writing and/or erasing operations. As a format of the second BB management information, the same format as the format of the first BB management information may be used.

2.2 Configuration of Controller 200

A configuration of the controller 200 is as illustrated in FIG. 6.

2.3 Operation

Next, with reference to flowcharts illustrated in FIGS. 29 to 32, an operation of canceling an inhibit command in the memory system according to the present embodiment will be described. The canceling operation is roughly performed as indicated by a dashed line in FIG. 29 instead of the above-described steps ST20 and ST30, and includes three steps such as steps ST40 to ST60. In other words, in the present embodiment, the above-described step ST10 is executed, and then the following three steps ST40 to ST60 are executed.

(Step ST40) writing of the second BB management information: If there is a block (an acquired bad block) which cannot be used due to deterioration over time during use of the memory system 1, the second BB management information is written into the dedicated block of the memory cell array 110.

(Step ST50) reading of the first BB management information and the second BB management information: The first BB management information and the second BB management information are read from the dedicated block.

(Step ST60) Cancellation of an inhibit command: If inhibit commands for the bad blocks are issued from the host apparatus, the first inhibit command and the second inhibit command for the bad blocks are separately canceled based on the first BB management information and the second BB management information.

Hereinafter, the steps ST40 to ST60 will be described in detail.

First, the second BB management information writing step ST40 will be described.

Figure 30:
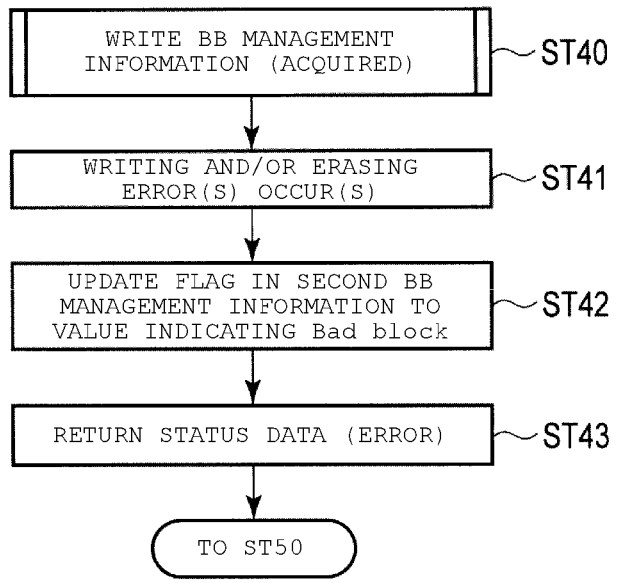

During use of the memory system 1, as illustrated in FIG. 30, the control circuit 440 performs a writing operation or an erasing operation of data based on a command held in the command register 430 and various signals input to the logic circuit 470. A writing error or an erasing error is assumed to occur during execution of the writing operation or the erasing operation (step ST41).

The control circuit 440 writes information indicating that the writing operation and the erasing operation are unsuccessful (failed) into the status register 410, as the status data ST_DAT. As described above, the status data ST_DAT is transmitted to the controller 200 and held in the feature table.

The controller 200 writes the second BB management information indicating an acquired bad block in which the writing error or the erasing error occurred, into the dedicated block BLK of the memory cell array 110 via the control circuit 440, based on the status data ST_DAT in the feature table. Specifically, the controller 200 updates the initial value "1" of the flag information in the second BB management information corresponding to the block in which the writing error or the erasing error occurred, to the value "0" indicating a bad block, by using the control circuit 440 (step ST42).

Thereafter, as described above, the control circuit 440 returns status data indicating the writing error or erasing error to the host apparatus 500 (step ST43).

Next, the first BB management information and second BB management information reading step ST50 will be described.

Figure 31:
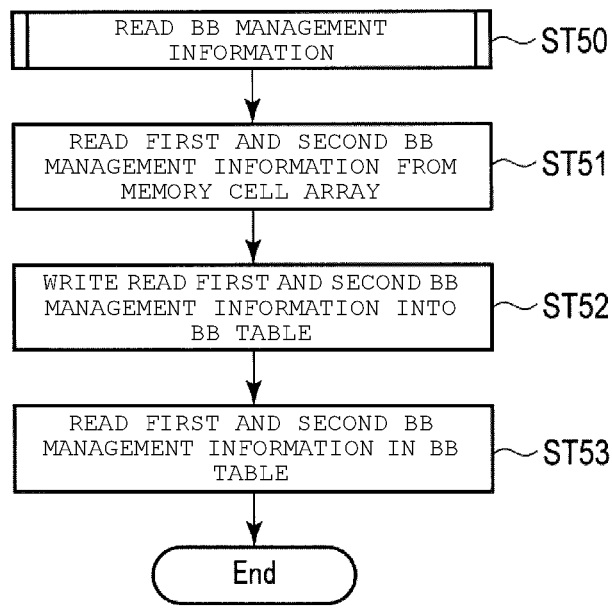

During use of the memory system 1, as illustrated in FIG. 31, the control circuit 440 reads the first BB management information and the second BB management information from the memory cell array 110 (step ST51), and writes the first BB management information and the second BB management information into the BB table 411 (step ST52).

Thereafter, the BB access control circuit 441 of the control circuit 440 reads the first BB management information and the second BB management information from the BB table 411 (step ST53), and proceeds to step ST60.

Finally, the inhibit command cancellation step ST60 will be described.

Figure 32:
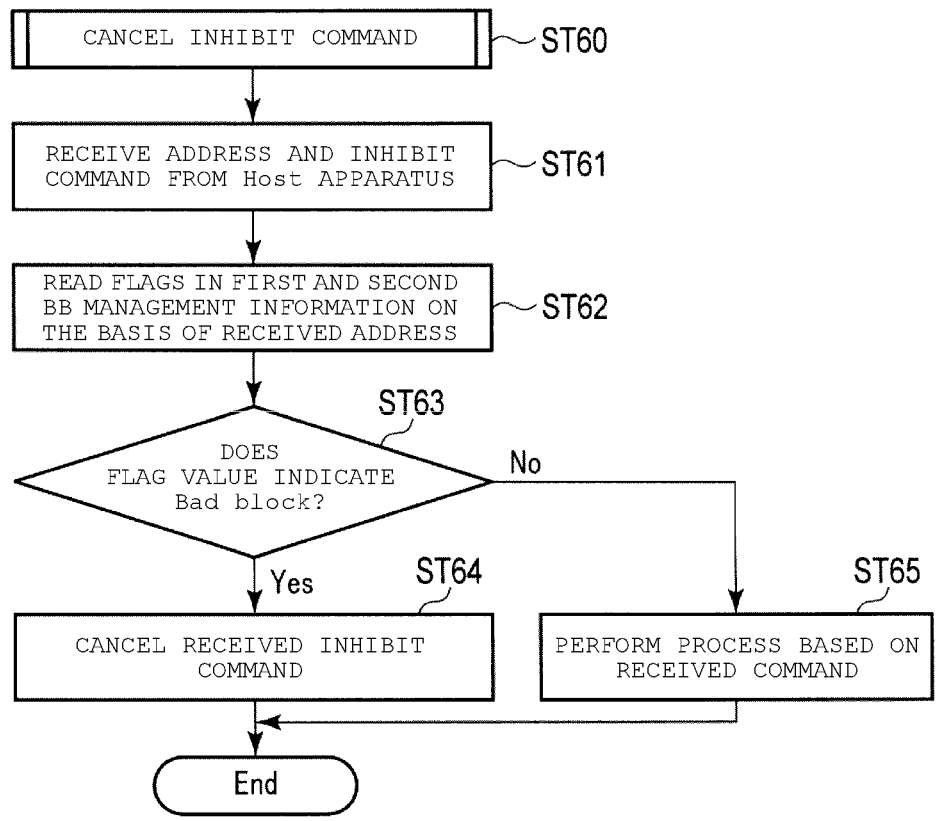

As illustrated in FIG. 32, the memory system 1 is assumed to receive a signal including a command and an address from the host apparatus 500 (step ST61). The controller 200 transmits the command and the address, which are recognized based on the signal received in step ST61, to the NAND-type flash memory 100 via the NAND bus.

The NAND-type flash memory 100 preserves the command and the address received via the NAND bus, in the command register 430 and the address register 420, respectively.

If the command is a first inhibit command or a second inhibit command for the bad block, the BB access control circuit 441 separately cancels the first inhibit command and the second inhibit command based on the first BB management information and the second BB management information (steps ST62 to ST64). Specifically, the BB access control circuit 441 reads flag information corresponding to a block number indicated by the address from the first BB management information or the second BB management information based on the address in the address register 420 (step ST62). Subsequently, the BB access control circuit 441 determines whether or not a value of the flag information indicates the bad block (step ST63), and cancels the command in the command register 430 if the value indicates the bad block. Consequently, the BB access control circuit 441 separately cancels the first inhibit command and the second inhibit command for the bad block (step ST64). Here, if the first inhibit command and the second inhibit command are separately canceled, that indicates that a writing error or an erasing error occurred.

Then, as described above, the control circuit 440 returns status data indicating the writing error or erasing error to the host apparatus 500.

On the other hand, if the value does not indicate the bad block as a determination result in step ST63, the control circuit 440 controls the NAND-type flash memory 100 to perform a process based on the command in the command register 430 (step ST65).

2.4 Advantage of Present Embodiment

According to the present embodiment, the same advantage as the one in the first embodiment can be achieved for an acquired bad block in addition to the advantage of the first embodiment. In other words, according to the present embodiment, even if an inhibit command for an acquired bad block is wrongly issued, the memory system 1 cancels the inhibit command, and thus erasing and writing operations on the acquired bad block can be prohibited. Similarly, according to the present embodiment, the host apparatus 500 does not need to read the bad block information, and thus improvement of system performance can be expected.

3. Third Embodiment

Next, a memory system according to a third embodiment will be described. In the present embodiment, the BB table 411 and the BB access control circuit 441 are arranged on the side of the controller 200 instead of on the side of the NAND-type flash memory 100 as in the first and second embodiments. Hereinafter, only a difference from the first and second embodiments will be described.

3.1 Configuration of NAND-Type Flash Memory 100

A configuration of the NAND-type flash memory 100 is as illustrated in FIG. 7, and the BB table 411 and the BB access control circuit 441 are omitted.

3.2 Configuration of Controller 200

Figure 33:
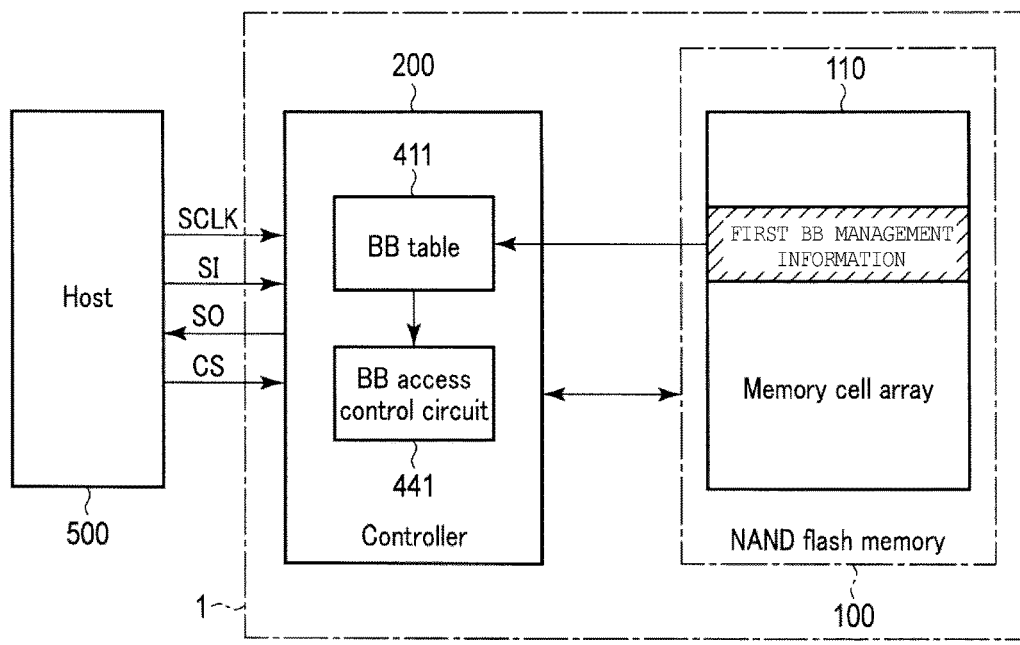
Figure 34:
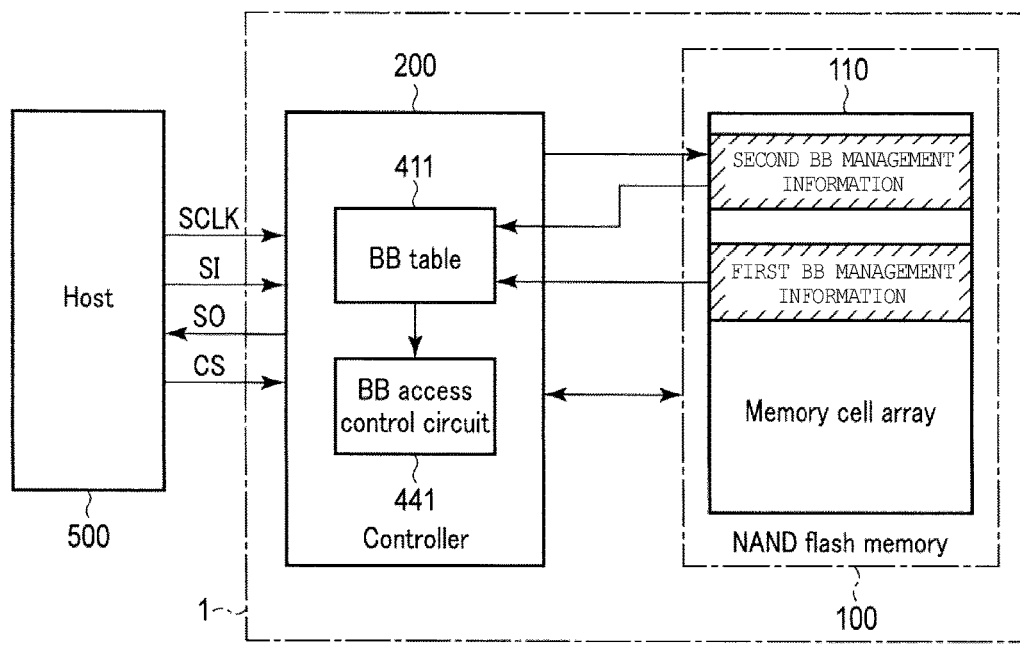

The controller 200 includes, as illustrated in FIG. 33 or 34, the BB table 411 and the BB access control circuit 441. Specifically, in the controller 200, for example, the BB table 411 is held in the status register 280 or the like in the configuration illustrated in FIG. 6, and the sequencer 250 functions as the BB access control circuit 441.

3.3 Operation

Next, an operation of canceling an inhibit command in the memory system according to the present embodiment will be described. In the present embodiment, the sequencer 250 of the controller 200 performs the above-described operation of the BB access control circuit 441. In other words, the sequencer 250 executes, for example, the above-described inhibit command cancellation step ST30 or ST60.

Consequently, the controller 200 can immediately cancel an inhibit command after the inhibit command is received from the host apparatus 500 and before the command is transmitted to the NAND-type flash memory 100. For this reason, improvement of performance can be expected.

3.4 Advantage of Present Embodiment

According to the present embodiment, since the BB table 411 and the BB access control circuit 441 are arranged on the side of the controller 200, further improvement of performance can be expected in addition to the advantages of the first and second embodiments.

4. Fourth Embodiment

Next, a memory system according to a fourth embodiment will be described. In the present embodiment, a register is additionally provided so that the table data (inherent/acquired) in the BB table 411 can be read from the host apparatus 500 side in each of the first to third embodiments. Hereinafter, the present embodiment is described as a modification example of the second embodiment, but the present embodiment is not limited thereto and may be a modification example of the first or third embodiment.

4.1 Configuration of NAND-Type Flash Memory 100

A configuration of the NAND-type flash memory 100 is as illustrated in FIG. 27.

4.2 Configuration of Controller 200

Figure 35:
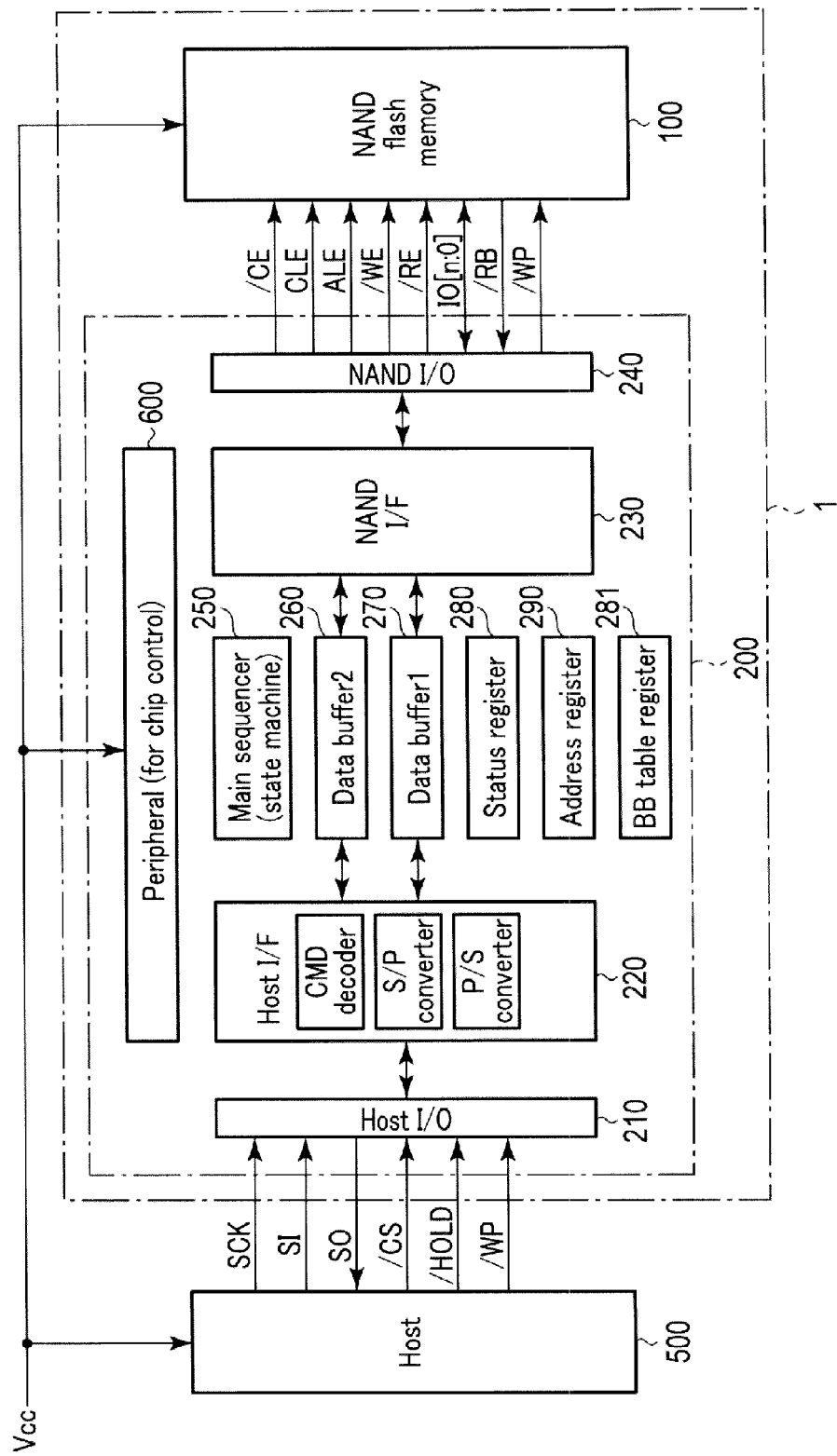
FIG. 35 is a block diagram of a memory system according to a fourth embodiment.

The controller 200 further includes a BB table register 281 which can hold the table data read from the BB table 411 as illustrated in FIG. 35, as compared with the configuration illustrated in FIG. 6.

If the first read command (CMD_RD1 (13h) in FIG. 21) is received from the host apparatus 500, the interface circuits 210 and 220 have a function of holding the table data read from the BB table 411 in the BB table register 281. In addition, if the second read command (CMD_GF (0Fh to 30h) in FIG. 26) which is different from the first read command is received, the interface circuits 210 and 220 have a function of outputting the table data held in the BB table register 281 to the host apparatus 500.

4.3 Operation

Next, an operation in the memory system according to the present embodiment will be described. In the present embodiment, after the above-described step ST53, in the controller 200, if the first read command is received from the host apparatus 500, the interface circuits 210 and 220 hold the table data read from the BB table 411 in the BB table register 281.

Thereafter, in the controller 200, the interface circuits 210 and 220 read the table data from the BB table register 281 and output the table data to the host apparatus 500.

The host apparatus 500 can be inhibited from issuing an inhibit command for a bad block based on the output table data.

4.4 Advantage of Present Embodiment

According to the present embodiment, the host apparatus 500 can be notified of the table data in which BB management information is described unlike a configuration in which the host apparatus 500 reads BB information of a leading page of each block for every block, and thus the number of times of reading on the host apparatus 500 side can be reduced. The host apparatus 500 can be inhibited from issuing an inhibit command for a bad block based on the transmitted table data. In addition, according to the present embodiment, among the first to third embodiments, an advantage of an applied embodiment can be achieved.

5. Fifth Embodiment

Next, a memory system according to a fifth embodiment will be described. In the present embodiment, if an inhibit command for an inherent bad block is issued from the host apparatus 500, a process based on the command is performed on the next good block without returning status data indicating an error in each of the first to fourth embodiments. Hereinafter, the present embodiment is described as a modification example of the first embodiment, but the present embodiment is not limited thereto and may be a modification example of the second, third, or fourth embodiment.

5.1 Configuration of NAND-Type Flash Memory 100

Figure 36:
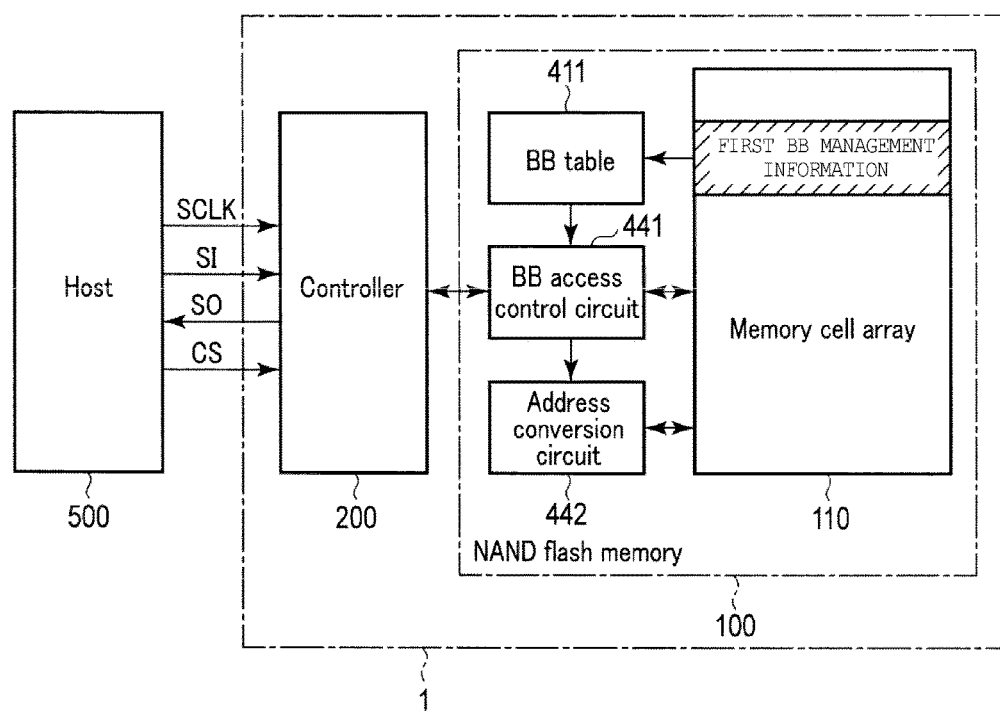
FIG. 36 schematically illustrates a memory system and a peripheral configuration thereof according to a fifth embodiment.
Figure 37:
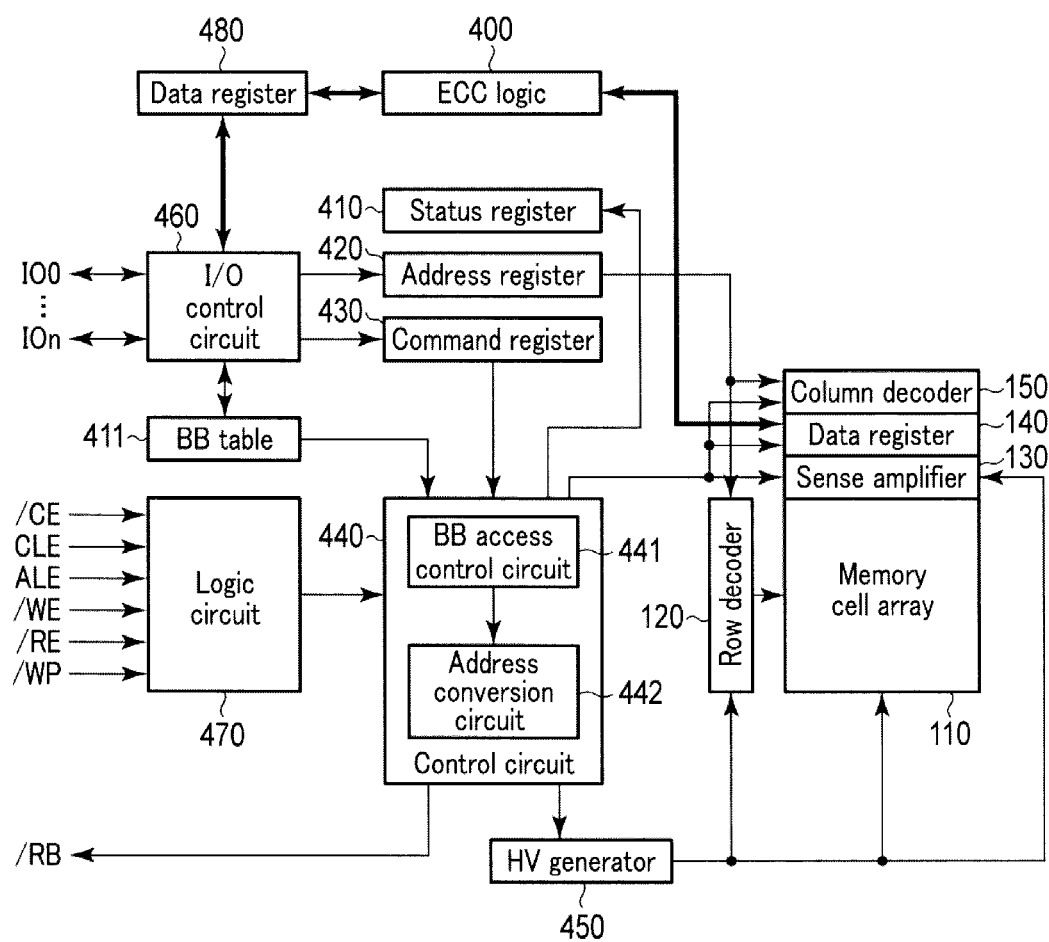
FIG. 37 is a block diagram of a NAND-type flash memory according to the fifth embodiment.

The NAND-type flash memory 100 further includes, as illustrated in FIGS. 36 and 37, an address conversion circuit 442 which performs an operation to be performed on a bad block, in response to an instruction given with the first inhibit command, on a good block, compared with the configuration illustrated in FIGS. 17 and 19.

Here, if the first inhibit command is canceled, the address conversion circuit 442 converts a logical address indicating a bad block targeted by the first inhibit command into a physical address indicating a good block which is different from the bad block. The address conversion circuit 442 is provided in, for example, the control circuit 440 in advance, based on the first BB management information indicating an inherent bad block.

Along with the address conversion, the control circuit 440 performs an erasing or writing operation on the good block indicated by the physical address.

5.2 Configuration of Controller 200

A configuration of the controller 200 is as illustrated in FIG. 6.

5.3 Operation

Figure 38:
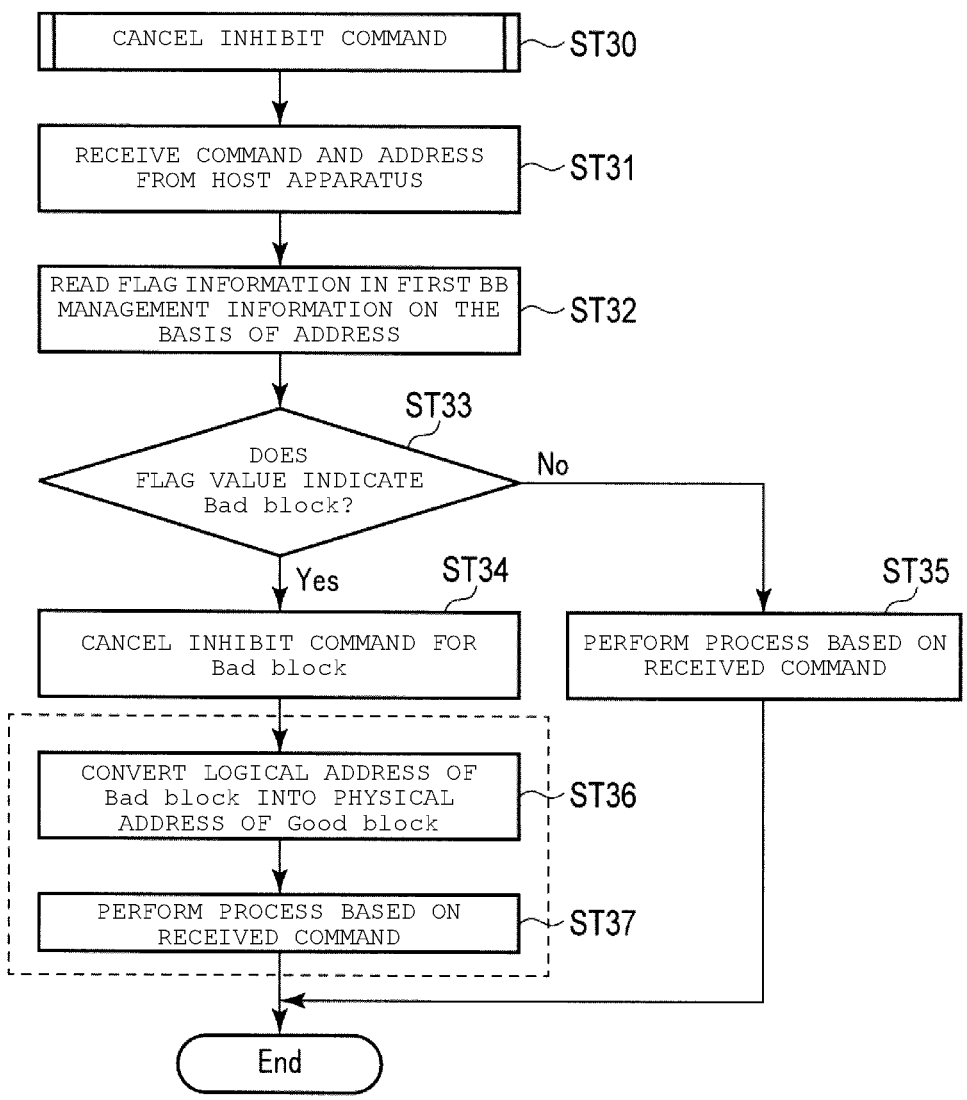
FIG. 38 is a flowchart illustrating an operation according to the fifth embodiment.

Next, with reference to a flowchart illustrated in FIG. 38, an operation of canceling an inhibit command in the memory system according to the present embodiment will be described. In the canceling operation, steps ST36 and ST37 are executed after the steps ST31 to ST34, as indicated by a dashed line in FIG. 38.

In other words, steps ST10, ST20, and ST31 to ST34 are executed in the same manner as described above, and the first inhibit command for the bad block is assumed to be canceled (step ST34). Here, the control circuit 440 does not return the status data indicating an error unlike the above embodiments.

On the other hand, if the first inhibit command is canceled in step ST34, the address conversion circuit 442 converts a logical address indicating the bad block targeted by the first inhibit command into a physical address indicating a good block which is different from the bad block (step ST36).

Thereafter, the control circuit 440 controls the NAND-type flash memory 100 to perform a process based on the command in the command register 430, and thus an erasing or writing operation on the good block indicated by the physical address is performed (step S37).

5.4 Advantage of Present Embodiment

According to the present embodiment, in addition to the advantage of the first embodiment, after the first inhibit command is canceled, an erasing or writing operation can be performed on a good block without issuing a command for other good blocks again.

In other words, the host apparatus 500 is not required to issue the same command twice or more, and thus improvement of system performance can be expected. For example, in the first embodiment, since an error is returned after the first inhibit command for a bad block is canceled, the host apparatus 500 requires time to issue commands until a block corresponds to a good block. In contrast, according to the present embodiment, such time can be reduced.

6. Modification Examples and the Like

As mentioned above, the memory system according to each of the above-described embodiments includes the first pin (pin No. 1 in FIG. 4) that is capable of receiving the chip select signal (/CS in FIG. 4) from the host apparatus; the second pin (pin No. 2 in FIG. 4) that is capable of outputting the first signal (SO in FIG. 4) to the host apparatus; the third pin (pin No. 5 in FIG. 4) that is capable of receiving the second signal (SI in FIG. 4) from the host apparatus; the fourth pin (pin No. 6 in FIG. 4) that is capable of receiving the clock (SCK in FIG. 4) from the host apparatus; the interface circuit (210 or 220 in FIG. 6); the memory cell array (110 in FIGS. 7, 17 and 18); and the cancellation control circuit (441 in FIGS. 17 and 19). The interface circuit recognizes, as a command, the second signal which is received by the third pin immediately after the asserted chip select signal is received. The memory cell array includes a plurality of blocks each having a memory cell which can hold data, and first bad block management information indicating a bad block among the plurality of blocks is written into a first area in advance. The cancellation control circuit cancels a first inhibit command based on the first bad block management information if the command is the first inhibit command for giving an instruction for an erasing or writing operation on the bad block.

According to this configuration, since the memory system cancels the first inhibit command for giving an instruction for an erasing or writing operation on the bad block based on the first bad block management information, the erasing or writing operation on the bad block can be inhibited.

Figure 39:
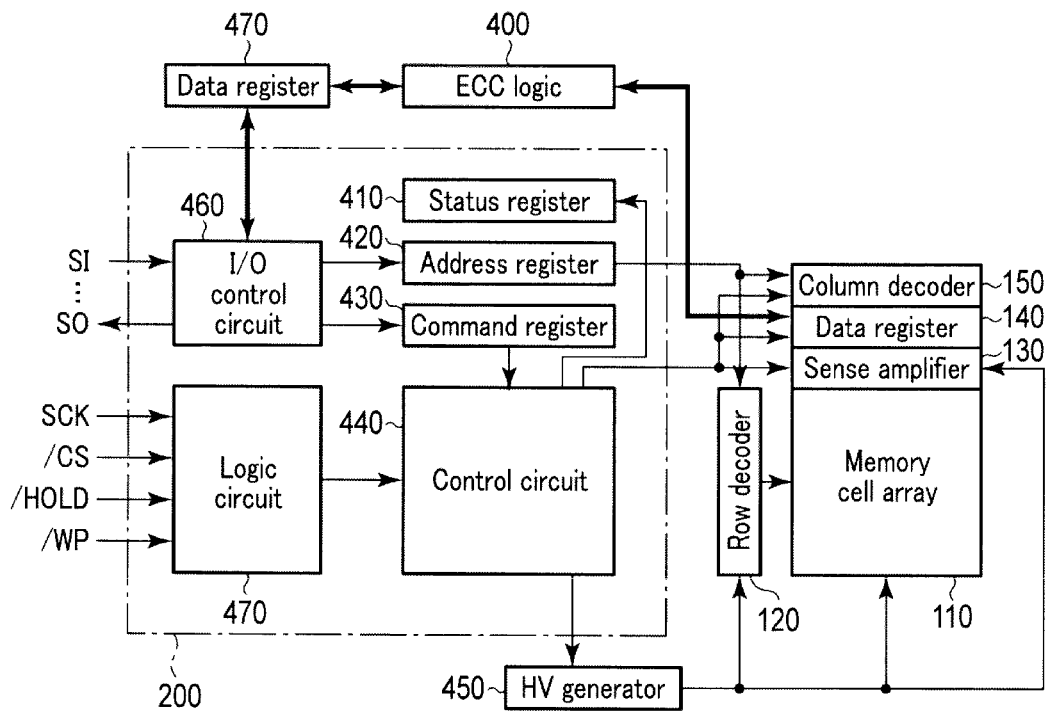
FIG. 39 is a block diagram of a memory system according to a modification example of one or more of the above embodiments.

Embodiments are not limited to the above-described embodiments and may have various modifications. For example, in the above-described embodiments, the NAND-type flash memory 100 and the controller 200 are implemented in separate semiconductor chips. However, the elements may be formed of one chip. FIG. 39 is a block diagram of the memory system 1 in this case.

As illustrated, a block configuration is the same as in FIG. 7, but the signals SCK, /CS, /HOLD and /WP from the host apparatus 500 are input to the logic circuit 470, and the signals SI and SO are input and output via the input/output control circuit 460. The registers 410 and 430, the control circuits 440 and 460, and the logic circuit 470 function as the controller 200. In other words, the control circuit 440 functions as the sequencer 250 and the host interface circuit 220, and distinguishes commands from the host apparatus 500 from each other by using the signal /CS. The input/output control circuit 460 and the logic circuit 470 function as the host input/output circuit 210. The registers 410 and 420 function as the registers 280 and 290, and the feature table is held in, for example, the status register 410 or the like.

The respective processes in the above-described flowcharts may be changed in order of the processes as appropriate.

The timing charts described in the above embodiments are only examples. The number of clock cycles required to input the signal SI and the number of clock cycles required to output the signal SO are not limited to those in the above embodiments. In addition, the case where dummy bits are input immediately after a command is issued depending on the command is described as an example, and should not be viewed as limiting.

The first to fifth embodiments may be arbitrarily combined with each other.

Figure 40:
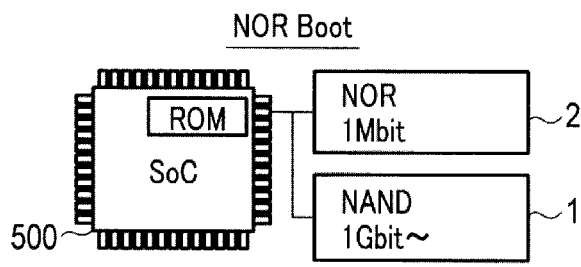
FIGS. 40 and 41 are each a conceptual diagram of a system using the memory system according to one or more of the embodiments.

The memory systems described in each of the above embodiments may be used to activate an application of, for example, a television set or a set top box. FIG. 40 illustrates an example of such a system. In FIG. 40, a NOR-type flash memory 2 is provided in addition to the memory system 1. Both the memory system 1 and the NOR-type flash memory 2 are connected to an SPI interface. In this example, commands (the commands CMD_RD1, CMD_RD2, CMD_GF, and CMD_SF, and the like) for controlling the memory system 1 are held in the NOR-type flash memory 2. During activation of the host apparatus 500, the host apparatus 500 reads the command information from the NOR-type flash memory 2 according to a sequence held in a ROM of the host apparatus 500. Then, the host apparatus 500 reads an activation sequence from the memory system 1 by using the command information, and the application is activated by executing the activation sequence.

Figure 41:
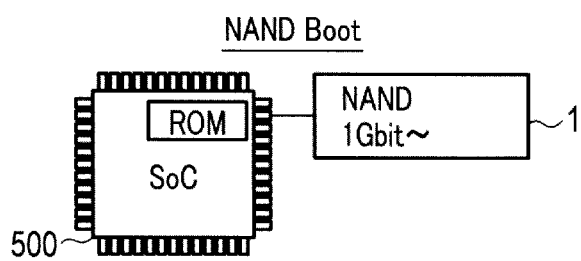

Alternatively, if the command information regarding the memory system 1 is held in the ROM of the host apparatus 500, the NOR-type flash memory 2 may be omitted as illustrated in FIG. 41.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a plurality of pins for connection to the outside of the memory system, the pins including a first pin configured to receive a chip select signal, a second pin configured to receive a clock signal, and a third pin configured to receive a command signal in synchronization with the clock signal;
   a memory cell array including a plurality of first memory blocks and a second memory block in which status data indicating whether or not each of the first memory blocks is defective is stored; and
   a control circuit configured to determine whether or not a first memory block targeted by the command signal is indicated as being defective in the status data, and allow an operation to be performed on the targeted first memory block in accordance with the command signal when the targeted first memory block is not indicated as being defective in the status data and block the operation to be performed on the targeted first memory block when the targeted first memory block is indicated as being defective in the status data.

2. The memory system according to claim 1, wherein the operation performed on the targeted first memory block is a write operation or an erase operation.

3. The memory system according to claim 1, wherein the status data for the first memory blocks is updated as the semiconductor memory device is being used.

4. The memory system according to claim 1, further comprising:
   a controller including an interface circuit configured to decode the command signal received from a host and a sequencer configured to issue a command to perform the operation on the targeted first memory block, based on the decoded command signal.

5. The memory system according to claim 4, wherein the controller is configured to recognize a signal received through the third pin immediately after the chip select signal is asserted, as the command.

6. The memory system according to claim 5, wherein the controller is implemented in a controller chip that also includes the control circuit.

7. The memory system according to claim 5, wherein the memory cell array implemented in a semiconductor memory chip that also includes the control circuit.

8. The memory system according to claim 1, wherein the control circuit is configured to allow the operation to be performed on a first memory block different from the targeted first memory block in accordance with the command signal when the targeted first memory block is indicated as being defective in the status data.

9. The memory system according to claim 1, wherein the plurality of pins is configured in accordance with a Serial Peripheral Interface (SPI) protocol.

10. A memory system, comprising:
a plurality of pins for connection to the outside of the memory system, the pins including a first pin configured to receive a chip select signal, a second pin configured to receive a clock signal, and a third pin configured to receive a command signal in synchronization with the clock signal; and
a semiconductor memory device including a memory cell array including a plurality of first memory blocks and a second memory block in which status data indicating whether or not each of the first memory blocks is defective is stored, and a control circuit configured to determine whether or not a first memory block targeted by the command signal is indicated as being defective in the status data, wherein
the control circuit allows an operation to be performed on the targeted first memory block in accordance with the command signal when the targeted first memory block is not indicated as being defective in the status data, and blocks the operation to be performed on the targeted first memory block when the targeted first memory block is indicated as being defective in the status data.

11. The memory system according to claim 10, wherein the operation performed on the targeted first memory block is a write operation or an erase operation.

12. The memory system according to claim 10, wherein the status data for the first memory blocks is updated as the semiconductor memory device is being used.

13. The memory system according to claim 10, further comprising:
a controller including an interface circuit configured to decode the command signal received from a host and a sequencer configured to issue a command to the control circuit to perform the operation on the targeted first memory block, based on the decoded command signal.

14. The memory system according to claim 10, wherein the controller is configured to recognize a signal received through the third pin immediately after the chip select signal is asserted, as the command.

15. The memory system according to claim 10, wherein the control circuit is configured to allow the operation to be performed on a first memory block different from the targeted first memory block in accordance with the command signal when the targeted first memory block is indicated as being defective in the status data.

16. The memory system according to claim 10, wherein the plurality of pins is configured in accordance with a Serial Peripheral Interface (SPI) protocol.

17. A memory system, comprising:
a plurality of pins for connection to the outside of the memory system, the pins including a first pin configured to receive a chip select signal, a second pin configured to receive a clock signal, and a third pin configured to receive a command signal in synchronization with the clock signal;
a semiconductor memory device including a memory cell array including a plurality of first memory blocks and a second memory block in which status data indicating whether or not each of the first memory blocks is defective is stored; and
a controller including an interface circuit configured to decode the command signal received from a host and a control circuit configured to generate a command for the semiconductor memory device based on the command signal and determine whether or not a first memory block targeted by the command is indicated as being defective in the status data, wherein
the control circuit issues the command to the semiconductor memory device to perform an operation on the targeted first memory block when the targeted first memory block is not indicated as being defective in the status data, and cancels the command when the targeted first memory block is indicated as being defective in the status data.

18. The memory system according to claim 17, wherein the operation performed on the targeted first memory block is a write operation or an erase operation.

19. The memory system according to claim 17, wherein the status data for the first memory blocks is updated as the semiconductor memory device is being used.

20. The memory system according to claim 17, wherein the control circuit is configured to issue a command to the semiconductor memory device to perform the operation on a first memory block different from the targeted first memory block in accordance with the command signal when the targeted first memory block is indicated as being defective in the status data.

* * * * *